(12) United States Patent
Seto

(10) Patent No.: US 7,622,855 B2
(45) Date of Patent: Nov. 24, 2009

(54) ACTUATOR, LIQUID DROPLET EJECTING HEAD, LIQUID DROPLET EJECTING DEVICE, AND METHOD OF MANUFACTURING ACTUATOR

(75) Inventor: Shinji Seto, Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 567 days.

(21) Appl. No.: 11/376,263

(22) Filed: Mar. 15, 2006

(65) Prior Publication Data

US 2007/0018540 A1    Jan. 25, 2007

(30) Foreign Application Priority Data

Jul. 25, 2005    (JP)    ............... 2005-214655

(51) Int. Cl.
*H01L 41/08*    (2006.01)
*B41J 2/045*    (2006.01)
(52) U.S. Cl. ............... 310/369; 347/68; 347/69; 347/70; 347/71; 347/72
(58) Field of Classification Search ............... 310/369; 347/68–72
See application file for complete search history.

(56) References Cited

U.S. PATENT DOCUMENTS

| | | | |
|---|---|---|---|
| 5,323,082 A * | 6/1994 | Wright | 310/328 |
| 6,020,674 A * | 2/2000 | Zhang et al. | 310/333 |
| 6,416,172 B2 * | 7/2002 | Jeong et al. | 347/72 |
| 6,717,337 B2 * | 4/2004 | Howarth et al. | 310/369 |
| 6,979,074 B2 * | 12/2005 | Watanabe et al. | 347/50 |
| 7,253,549 B2 * | 8/2007 | Tavkhelidze et al. | 310/306 |
| 7,258,428 B2 * | 8/2007 | Reddy et al. | 347/68 |
| 2002/0084290 A1 * | 7/2002 | Materna | 222/420 |
| 2002/0089262 A1 * | 7/2002 | Topa et al. | 310/334 |
| 2006/0244347 A1 * | 11/2006 | Bae et al. | 310/369 |
| 2007/0262679 A1 * | 11/2007 | Maruyama et al. | 310/369 |

FOREIGN PATENT DOCUMENTS

| | | |
|---|---|---|
| JP | 2850762 | 11/1998 |
| JP | 2004-247703 | 9/2004 |

* cited by examiner

*Primary Examiner*—Jaydi SanMartin
(74) *Attorney, Agent, or Firm*—Fildes & Outland, P.C.

(57) ABSTRACT

An actuator has: a piezoelectric body formed in a shape of a tube and having an inner side wall, which faces a hollow portion of the tube, and an outer side wall, which is structured at an outer side of the tube; a first electrode formed at the inner side wall of the piezoelectric body; and a second electrode formed at the outer side wall of the piezoelectric body. The actuator displaces the piezoelectric body by a potential difference between the first electrode and the second electrode.

18 Claims, 20 Drawing Sheets

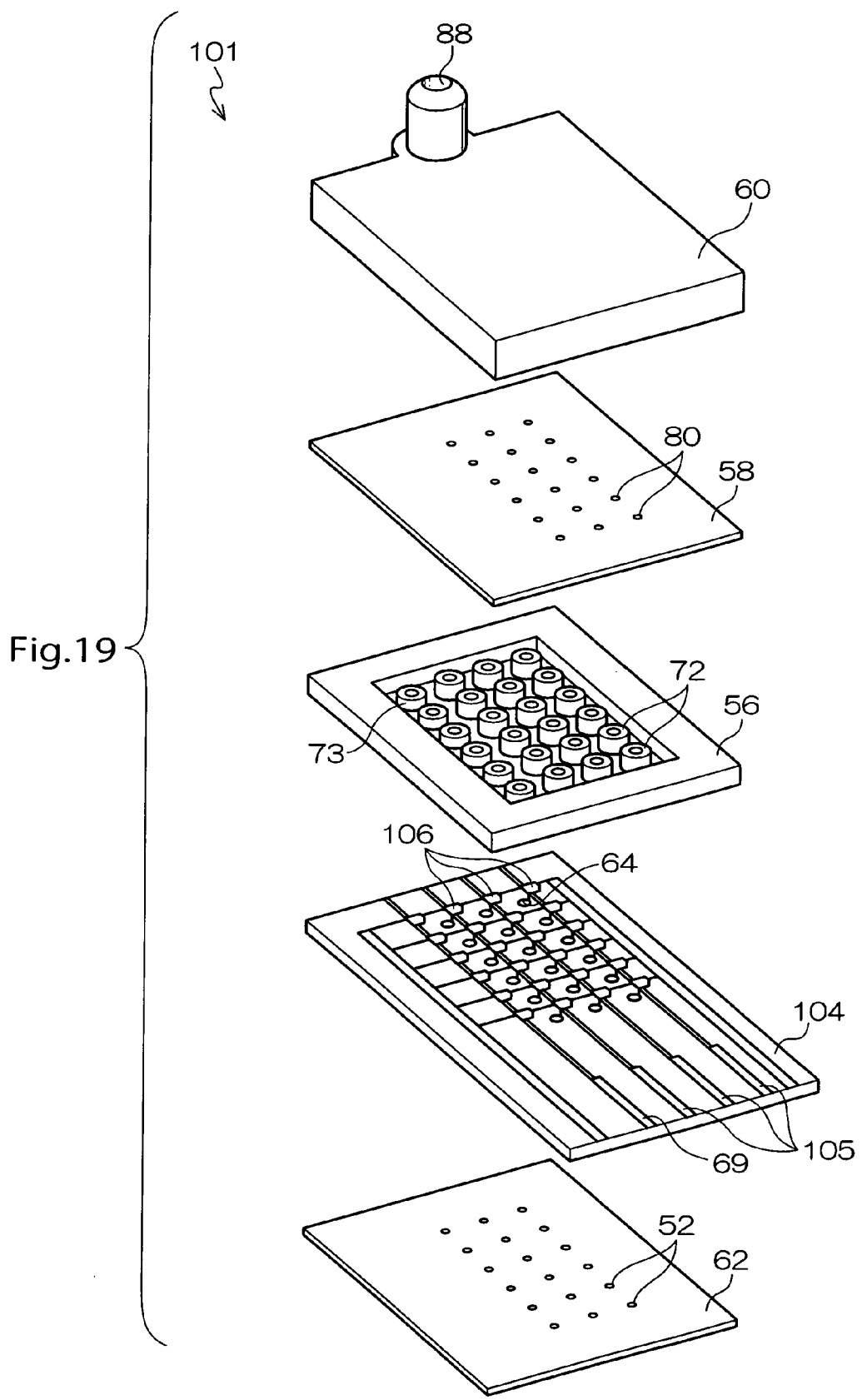

ACTUATOR, LIQUID DROPLET EJECTING HEAD, LIQUID DROPLET EJECTING DEVICE, AND METHOD OF MANUFACTURING ACTUATOR

CROSS-REFERENCE TO RELATED APPLICATION

This application claims priority under 35 USC 119 from Japanese Patent Application No. 2005-214655, the disclosure of which is incorporated by reference herein.

BACKGROUND OF THE INVENTION

1. Field of the Invention

The present invention relates to an actuator which is used in an inkjet recording head which carries out printing on a recording medium by ejecting ink drops from nozzles, or the like, and to a method of manufacturing the actuator, a liquid droplet ejecting head using the actuator, and a liquid droplet ejecting device.

2. Description of the Related Art

In recent years, various types of displacement controlling elements are being used as actuators. For example, Japanese Patent Application Laid-Open (JP-A) No. 2004-247703 discloses a piezoelectric/electrostrictive device in which piezoelectric/electrostrictive bodies 4 which are shaped as rectangular plates stand erect on a ceramic substrate 2, and pairs of electrodes 18, 19 are formed on the both surfaces thereof. In this piezoelectric/electrostrictive device disclosed in JP-A No. 2004-247703, in order to make the amount of displacement large, the piezoelectric/electrostrictive bodies 4 stand erect such that the longitudinal directions thereof are orthogonal to the ceramic substrate 2. However, because the individual piezoelectric/electrostrictive bodies 4 are plate-shaped, there is the problem that they fall over easily and are unstable.

On the other hand, Japanese Patent No. 2850762 discloses a piezoelectric element in which a groove 111 is provided in a rectangular parallelepiped piezoelectric material 109, a plurality of intermediate electrodes 117 are formed at an intermediate portion in the heightwise direction of the piezoelectric material 109, and a common electrode is formed in the groove 111. Because the piezoelectric material 109 disclosed in Japanese Patent No. 2850762 is parallelepiped, the stability thereof is better than that of a plate-shaped material. However, because the plurality of intermediate electrodes 117 are formed at the intermediate portion in the heightwise direction of the parallelepiped member, it is difficult to pull the piezoelectric material 109 out.

SUMMARY OF THE INVENTION

The present invention has been made in view of the aforementioned, and provides an actuator in which a large amount of displacement can be obtained and in which electrode formation is easy, and a method of manufacturing the actuator, a liquid droplet ejecting head using the actuator, and a liquid droplet ejecting device.

To this end, an actuator of a first aspect comprises a piezoelectric body formed in a shape of a tube and having an inner side wall, which faces a hollow portion of the tube, and an outer side wall, which is structured at an outer side of the tube; a first electrode formed at the inner side wall of the piezoelectric body; and a second electrode formed at the outer side wall of the piezoelectric body, wherein the actuator displaces the piezoelectric body by a potential difference between the first electrode and the second electrode.

The actuator of the first aspect has a piezoelectric body which is formed in the shape of a tube. Here, the shape of the tube is not limited to a cylindrical tube shape, and includes all shapes in which a hollow portion is formed at the central portion of a pillar-like body. It also includes shapes in which a cut-out is formed in a portion of a side wall portion of a tube such that the hollow portion communicates with the exterior at the side wall portion.

The first electrode is formed at the inner side wall which faces the hollow region of the piezoelectric body. The second electrode is formed at the outer side wall which is structured at the outer side of the piezoelectric body. The piezoelectric body is displaced due to the potential difference between the first electrode and the second electrode.

In accordance with the above-described structure, because the configuration of the piezoelectric body is tubular, a large amount of displacement can be obtained by making the tube tall in the heightwise direction.

Further, because the electrodes are formed at the inner side wall and the outer side wall of the tube, the electrodes can be formed easily. Moreover, because a pair of electrodes are formed at one piezoelectric body, the respective electrodes can be pulled-out easily.

A liquid droplet ejecting head of a second aspect comprises an actuator which has: a piezoelectric body formed in a shape of a tube and having an inner side wall, which faces a hollow portion of the tube, and an outer side wall, which is structured at an outer side of the tube; a first electrode formed at the inner side wall of the piezoelectric body; and a second electrode formed at the outer side wall of the piezoelectric body, wherein the actuator displaces the piezoelectric body by a potential difference between the first electrode and the second electrode.

In accordance with the above-described liquid droplet ejecting head, owing to the actuator, a large displacement amount can be obtained, and pulling-out of the electrodes can also be carried out easily.

A liquid droplet ejecting device of a third aspect comprises a liquid droplet ejecting head having an actuator, the actuator having: a piezoelectric body formed in a shape of a tube and having an inner side wall, which faces a hollow portion of the tube, and an outer side wall, which is structured at an outer side of the tube; a first electrode formed at the inner side wall of the piezoelectric body; and a second electrode formed at the outer side wall of the piezoelectric body, wherein the actuator displaces the piezoelectric body by a potential difference between the first electrode and the second electrode.

A method of manufacturing an actuator of a fourth aspect comprises: an electrode forming step of forming an electrode in one step at (a) an inner side wall of a piezoelectric body formed in a shape of a tube, which inner side wall faces a hollow region, (b) an outer side wall of the piezoelectric body, which outer side wall is structured at an outer side surface, and (c) a distal end surface of the piezoelectric body; and a separating step of removing the electrode formed at the distal end surface, and separating a first electrode, which is formed at the inner side wall of the piezoelectric body, and a second electrode, which is formed at the outer side wall of the piezoelectric body.

In the electrode forming step, an electrode is formed over the entire surface of one side of the piezoelectric body. In the separating step, the electrode at the distal end surface of the piezoelectric body is removed, and the first electrode and the second electrode are separated. The electrodes can thereby easily be formed.

BRIEF DESCRIPTION OF THE DRAWINGS

Preferred embodiments of the present invention will be described in detail based on following figures, wherein:

FIG. 19 is an exploded perspective view showing a disassembled state of the inkjet recording head of the fourth embodiment of the present invention.

DETAILED DESCRIPTION OF THE INVENTION

Hereinafter, inkjet recording heads and inkjet recording devices relating to embodiments of the present invention will be described with reference to the drawings.

First Embodiment

First, an overview of an inkjet recording device 100 will be described by using FIG. 1. Note that the recording medium is described as a recording sheet P. Further, in FIG. 1, the conveying direction of the recording sheet P in the inkjet recording device 100 is designated by arrow S as the subscanning direction, and the direction orthogonal to the conveying direction is designated by arrow M as the main scanning direction.

Figure 1:
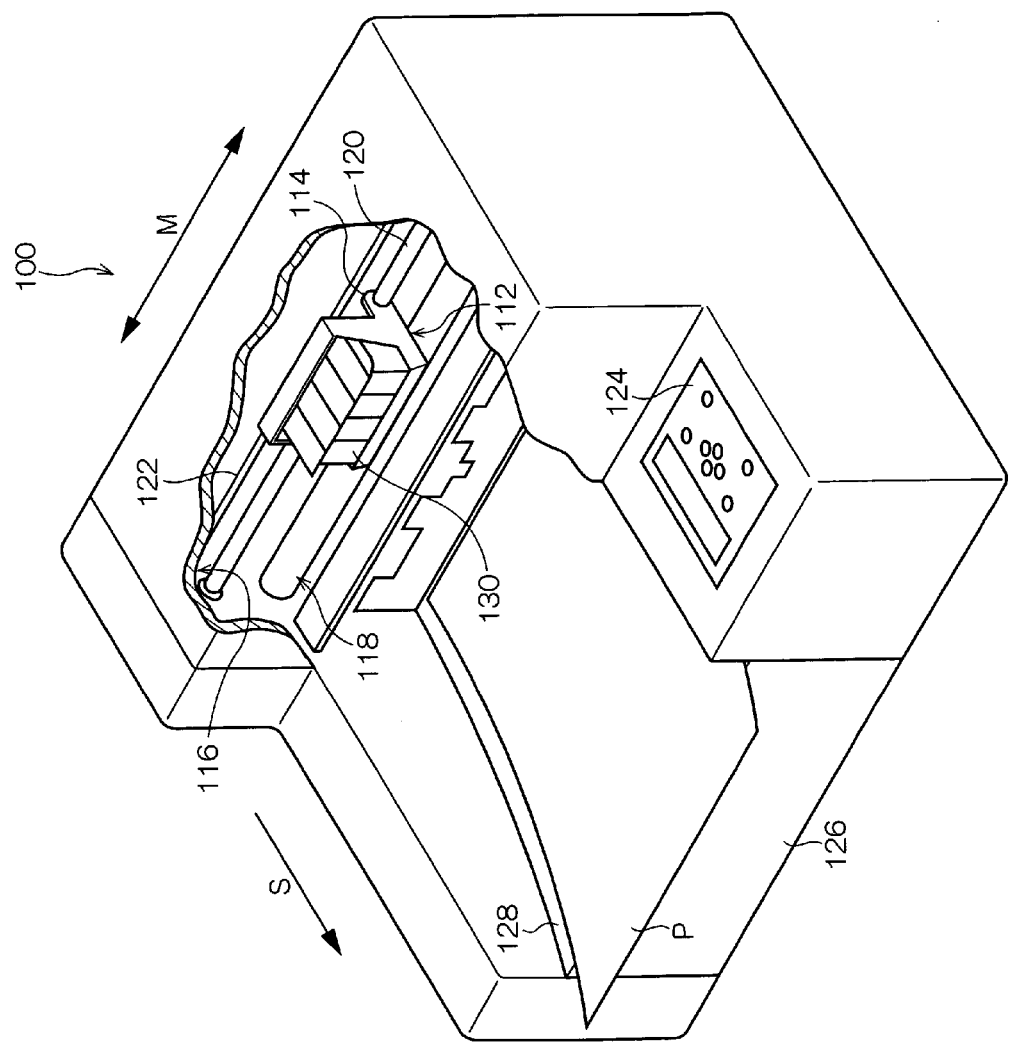
FIG. 1 is a perspective view showing the exterior of an inkjet recording device of a first embodiment of the present invention.

As shown in FIG. 1, the inkjet recording device 100 relating to the present embodiment has a carriage 112 carrying inkjet recording units 130 (inkjet recording heads 10) of black, yellow, magenta, and cyan. A pair of brackets 114 are provided at the carriage 112 to project out at the upstream side in the conveying direction of the recording sheet P (only the bracket 114 at one side is shown in FIG. 1). A shaft 120, which spans along the main scanning direction, is inserted through circular holes formed in the pair of brackets 114.

A driving pulley (not shown) and a driven pulley (not shown), which structure a main scanning mechanism 116, are disposed at the main scanning direction both end sides of the carriage 112. A portion of a timing belt 122, which is trained around the driving pulley and the driven pulley and which travels in the main scanning direction, is fixed to the carriage 112. In this way, when the timing belt 122 travels in the main scanning direction due to the driving and rotating of the driving pulley, the pair of brackets 114 are guided by the shaft 120 such that the carriage 112 moves reciprocatingly in the main scanning direction.

A sheet feed tray 126, in which the recording sheets P before image printing are accommodated in a bundle, is provided at the lower portion of the front side of the inkjet recording device 100. A sheet discharge tray 128 is provided above the sheet feed tray 126. The recording sheets P, on which images have been printed by the inkjet recording units 130 of the respective colors, are discharged out onto the sheet discharge tray 128. Further, a subscanning mechanism 118, which is formed from conveying rollers and discharge rollers which convey, at a predetermined pitch and in the subscanning direction, the recording sheets P which are supplied from the sheet feed tray 126 one-by-one, is provided beneath the carriage 112 and the shaft 120.

In addition, a control panel 124 which carries out various types of settings at the time of printing, a maintenance station (not shown), and the like are provided at the inkjet recording device 100. The maintenance station is structured so as to include capping members, suction pumps, dummy jet receptacles, cleaning mechanisms, and the like, and carries out maintenance operations such as suction/recovery, dummy jetting, cleaning, and the like.

At the inkjet recording unit 130 of each color, the inkjet recording head 10 shown in FIG. 2, and an ink tank (not shown) supplying ink thereto, are structured integrally. The inkjet recording unit 130 is mounted on the carriage 112 such that a plurality of nozzles 12A, which are formed in the bottom surface (the ink ejecting surface) of the inkjet recording head 10, face the recording sheet P. In this way, while the inkjet recording heads 10 are moved in the main scanning direction by the main scanning mechanism 116, ink drops are selectively ejected from the nozzles 12A onto the recording sheet P, and a portion of an image based on image data is thereby recorded on a predetermined band region.

Then, when movement one time in the main scanning direction is finished, the recording sheet P is conveyed a predetermined pitch in the subscanning direction by the subscanning mechanism 118. While the inkjet recording heads 10 (the inkjet recording units 130) again move in the main scanning direction (the direction opposite to that in the above-described operation), a portion of the image based on the image data is recorded in the next band region. By repeating this operation plural times, the entire image based on the image data is recorded in full-color on the recording sheet P.

The inkjet recording device 100 is structured as described above. Next, the inkjet recording head 10 mounted in the inkjet recording device 100 will be described in detail.

Figure 2A:
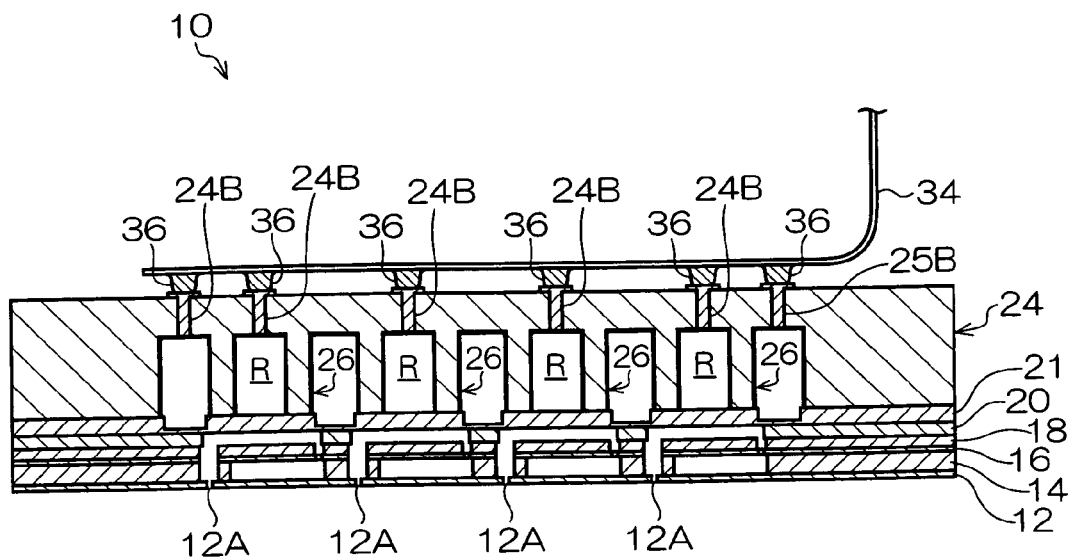
FIG. 2A is a sectional view of an inkjet head of the first embodiment of the present invention.

The inkjet recording head 10 of the present embodiment which is shown in FIG. 2A is structured such that a nozzle plate 12, an ink pool plate 14, flow path plates 16, 18, a pressure chamber plate 20, a vibrating plate 21, an actuator 24, and an electric wiring board 34 are layered in that order from the bottom side in the drawing, and these respective members are joined together.

The plurality of nozzles 12A, which are formed from circular through-holes, are disposed in the form of a matrix in the nozzle plate 12. The lower sides of ink pools 14A which will be described later are structured by the nozzle plate 12.

Figure 2B:
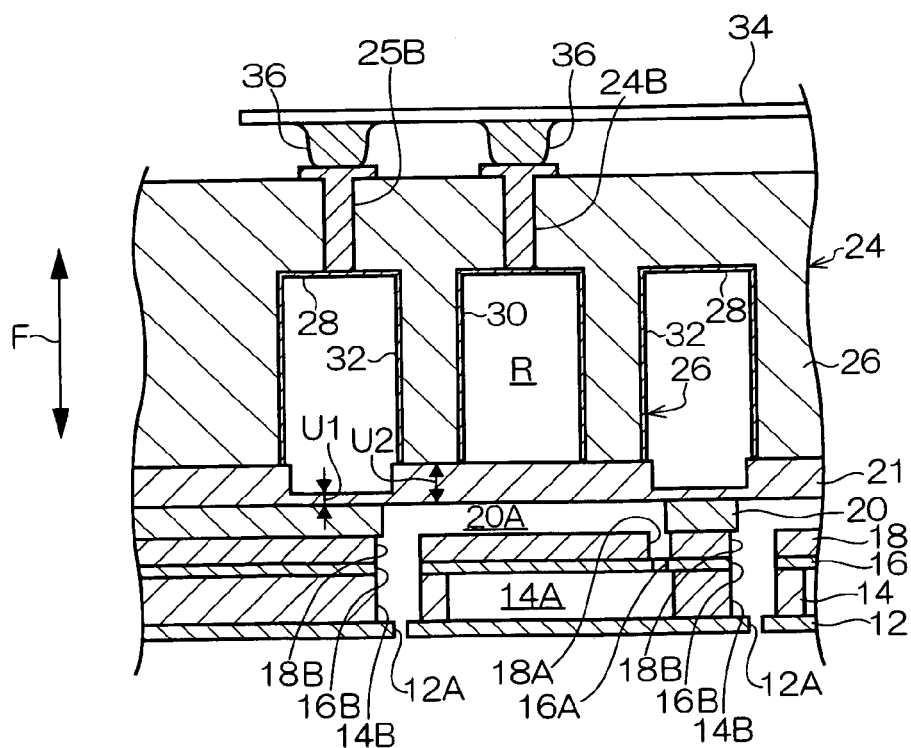
FIG. 2B is an enlarged sectional view of the inkjet head of the first embodiment of the present invention.

As shown in FIG. 2B, the ink pool plate 14 is joined to the side of the nozzle plate 12 opposite the ink ejecting side thereof. The ink pools 14A which store ink, and communicating openings 14B which communicate with the nozzles 12A, are formed in the ink pool plate 14. Inks from ink tanks (not shown) are supplied to the ink pools 14A.

The flow path plate 16 is joined to the ink pool plate 14, and the upper sides of the ink pools 14A are structured by the flow path plate 16. Flow paths 16A, which communicate the ink pools 14A and pressure chambers 20A which will be described later, and communicating openings 16B, which communicate the pressure chambers 20A and the nozzles 12A, are formed in the flow path plate 16.

The flow path plate 18 is joined to the flow path plate 16, and the lower sides of the pressure chambers 20A are structured by the flow path plate 18. Flow paths 18A, which communicate the ink pools 14A and the pressure chambers 20A, and communicating openings 18B, which communicate the pressure chambers 20A and the nozzles 12A, are formed in the flow path plate 18.

The pressure chamber plate 20 is joined to the flow path plate 18. The pressure chambers 20A, in which are filled ink to which pressure is applied by the vibrating plate 21, are formed in the pressure chamber plate 20. The pressure chamber 20A is formed for each nozzle 12A. The ink stored in the ink pool 14A reaches the pressure chamber 20A via the flow paths 16A, 18A, and is ejected from the pressure chamber 20A via the communicating openings 18B, 16B and the nozzle 12A.

The vibrating plate 21 is disposed at the upper side of the pressure chamber plate 20. The portions of the vibrating plate 21 where the pressure chambers 20A are formed are exposed to the pressure chambers 20A and structure portions of the pressure chambers 20A. A thickness U1 of the vibrating plate 21 at the portions which do not face the pressure chambers 20A is formed to be thinner than a thickness U2 at the portions which face the pressure chambers 20A, and to have lower rigidity.

Figure 3:
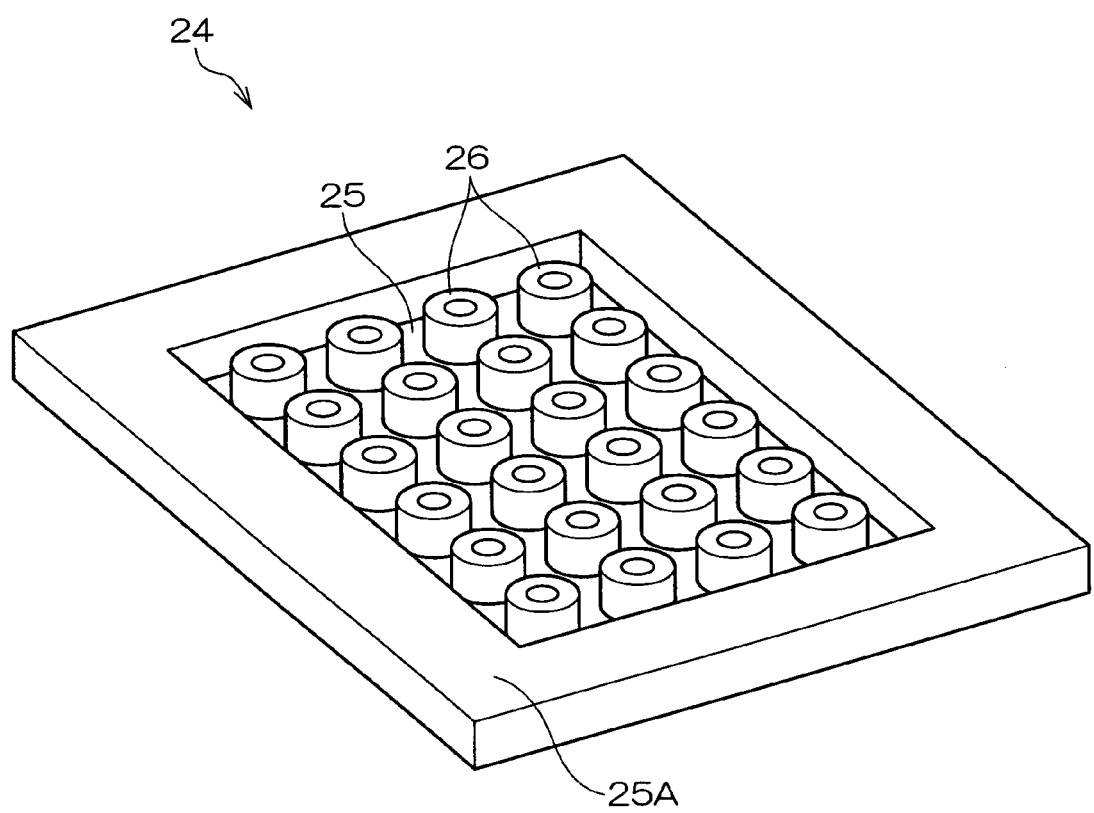
FIG. 3 is a perspective view showing the exterior of an actuator of the first embodiment of the present invention.

As shown in FIG. 3, the actuator 24 has a rectangular-plate-shaped base 25, and cylindrical-tubular piezoelectric bodies 26. The piezoelectric bodies 26 are arranged in the form of a matrix, so as to correspond to the respective nozzles 12A. One ends of the piezoelectric bodies 26 are formed integrally with the base 25 so as to be disposed at the base 25 side. A frame portion 25A, whose thickness is thicker than the inner side, is formed at the peripheral edge portion of the base 25.

Figure 4:
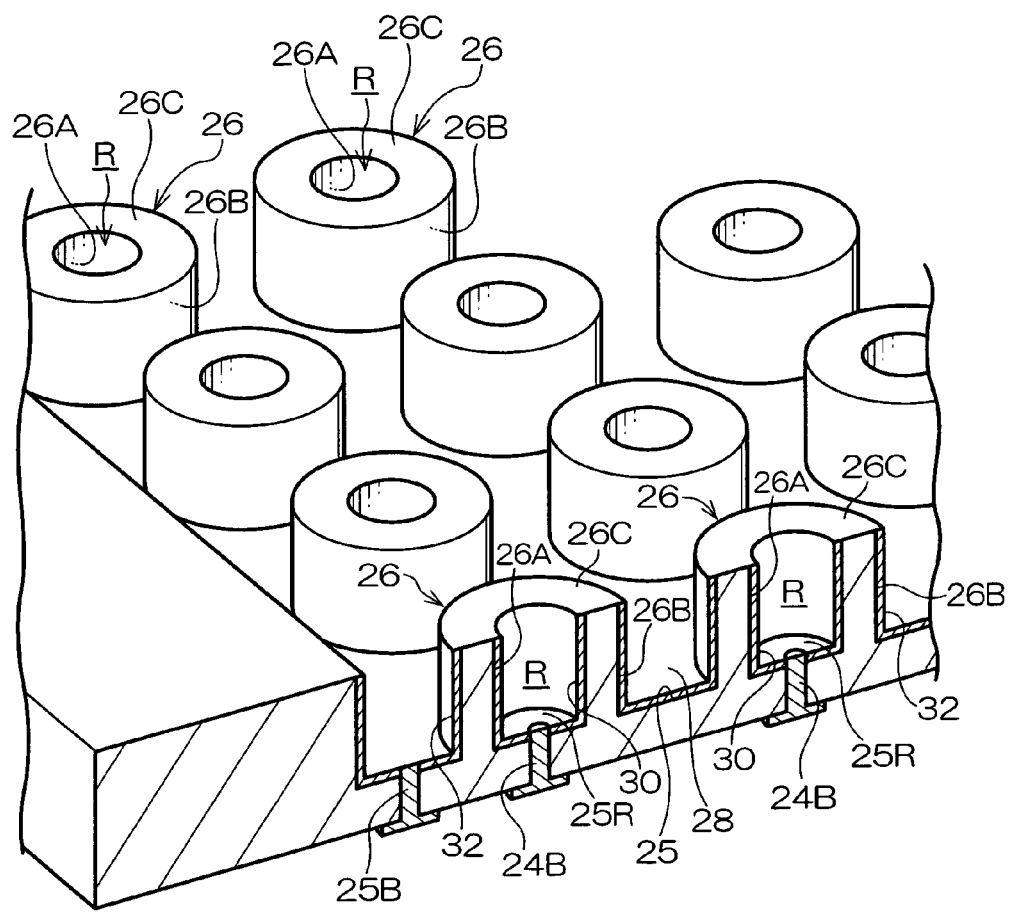
FIG. 4 is an enlarged perspective view of a portion of the actuator of the first embodiment of the present invention.

As shown in FIG. 4 as well, a hollow portion R, which passes through in the direction of thickness, is formed in the piezoelectric body 26, and an inner side wall 26A of the piezoelectric body 26 faces the hollow portion R. An outer side wall 26B is formed at the outer peripheral surface of the piezoelectric body 26, and a distal end surface 26C is formed at the distal end of the piezoelectric body 26. The actuator 24 is layered on the vibrating plate 21 with the distal end surfaces 26C disposed on the vibrating plate 21.

A first electrode 30 is formed at the inner side wall 26A of the actuator 24 and at the top portion of the base 25 exposed at the hollow region R (hereinafter called "portion 25R of the base corresponding to the hollow region"), so as to cover the entire surfaces of the inner side wall 26A and the portion 25R of the base corresponding to the hollow region. A via 24B is formed from the central portion of the portion 25R of the base corresponding to the hollow region to the reverse surface side of the base 25 (the side at which the piezoelectric bodies 26 are not disposed). The first electrodes 30 are pulled-out to the reverse surface side of the base 25 via the vias 24B.

A second electrode 32 is formed at the outer side wall 26B of the actuator 24, so as to cover the entire surface of the outer side wall 26B. A top surface electrode 28 is formed at the top surface of the base 25, at the portions where the piezoelectric bodies 26 are not disposed. The respective second electrodes 32 of the actuator 24 are formed to be continuous with the top surface electrode 28, and are electrically connected to one another. Accordingly, the respective second electrodes 32 of the actuator 24 are electrodes which are common to the respective piezoelectric bodies 26 disposed on the base 25.

Vias 25B, which pass-through the base 25 in the direction of thickness, are formed between the frame portion 25A and the piezoelectric bodies 26 which are disposed at the outermost side. The vias 25B pull-out the second electrodes 32 and the top surface electrode 28 to the reverse surface side of the base 25.

The electric wiring board 34 is disposed at the reverse surface side of the base 25. The first electrodes 30 and the second electrodes 32 of the respective piezoelectric bodies 26 are joined, via the vias 24B and the vias 25B and by solder 36, to corresponding terminals of the electric wiring board 34. The respective wires of the electric wiring board 34 are connected to a driving IC or the like (not shown), and transmit electric signals such that a potential difference arises between the first electrodes 30 and the second electrodes 32.

Each of the piezoelectric bodies 26 is structured such that, when a potential difference arises between the first electrode 30 and the second electrode 32, the polarization direction becomes the in-out direction of the piezoelectric body 26. Further, due to the piezoelectric body 26 being structured such that the side surface in the polarization direction (the outer side wall 26B) is connected to the base 25, the piezoelectric body 26 is structured as a so-called wall-type piezoelectric element. In this way, the piezoelectric body 26 is displaced in the direction of arrow F, which is the direction of thickness of the actuator 24, due to the electric signal from the driving IC (not shown).

The operation and effects of printing (ink ejection) by the inkjet recording head 10 of the above-described, present embodiment will be described next.

In the printing by the inkjet recording head 10, first, the ink which is pooled in the ink pool 14A is supplied to the pressure chamber 20A via the flow paths 16A, 18A, and is filled into the nozzle 12A from the pressure chamber 20A via the communicating openings 18B, 16B. At this time, an ink meniscus is formed at the distal end (the ejecting opening) of the nozzle 12A.

Figure 5:
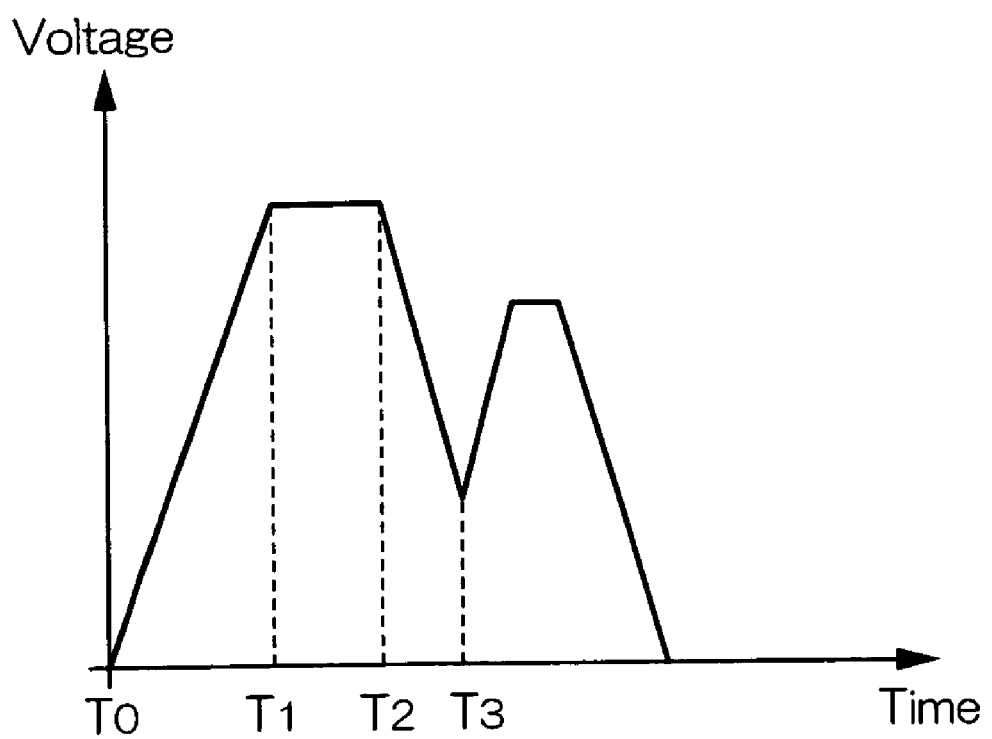
FIG. 5 is an example of a driving waveform which drives the actuator of the first embodiment of the present invention.
Figure 6A:
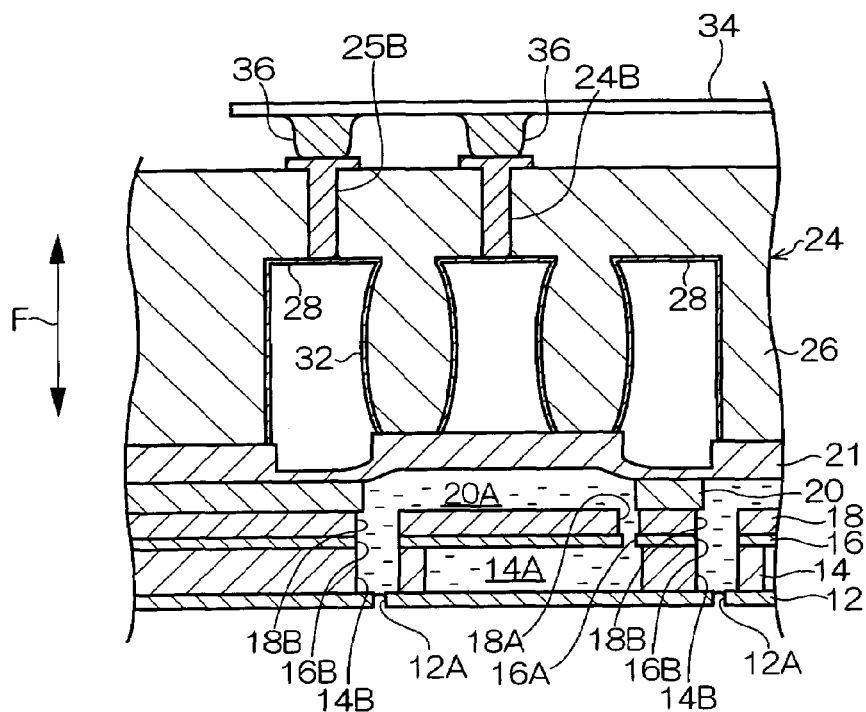
FIG. 6A is a sectional view showing operation at the time of drawing-in ink, of the actuator of the first embodiment of the present invention.
Figure 6:
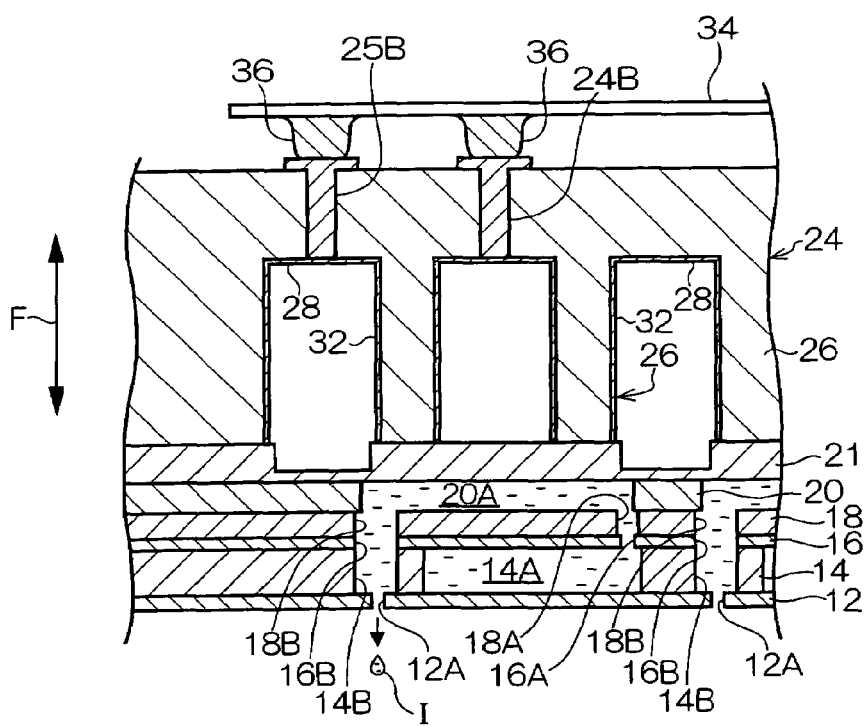
FIG. 6B is a sectional view showing operation at the time of ejecting ink, of the actuator of the first embodiment of the present invention.

In this state, an electric signal of the driving waveform shown in FIG. 5 is transmitted from the driving IC to the first electrode 30. First, at T0 to T1, voltage is applied to the first electrode 30, and this voltage is continued until T2. A potential difference thereby arises between the first electrode 30 and the second electrode 32. As shown in FIG. 6A, the piezoelectric body 26 is displaced in the direction of arrow F such that the pressure of the pressure chamber 20A is reduced, and the ink meniscus of the nozzle 12A is pulled-in in a concave form toward the pressure chamber 20A side.

Next, at T2 to T3, the applied voltage decreases. In this way, the potential difference between the first electrode 30 and the second electrode 32 becomes smaller, and the piezoelectric body 26 is displaced, from the above-described displaced state, in the direction of arrow F opposite to that in the above. Due to this displacement, the ink pooled in the pressure chamber 20A is pressurized, and as shown in FIG. 6B, an ink drop is ejected from the nozzle 12A (so-called pulling driving).

The actuator 24 of the present embodiment has the tubular piezoelectric bodies 26. Therefore, by making the height large, a large displacement can be obtained, as compared with a case in which planar piezoelectric bodies are laid flat. Further, as compared with a case in which planar piezoelectric bodies stand erect and are displaced, it is difficult for the piezoelectric bodies to collapse, and the stability can be ensured. Further, because the first electrodes 30 and the second electrodes 32 are separated at the inner sides and the outer sides of the tubes, the respective electrodes can be easily pulled-out as compared with a case in which planar piezoelectric bodies are laminated.

The method of the present embodiment of manufacturing the actuator 24 will be described next.

Figure 7A:
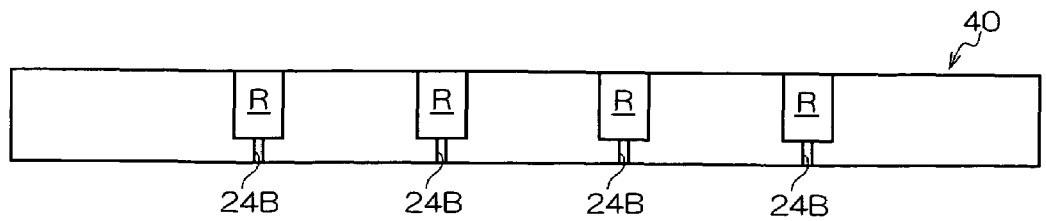
FIGS. 7A through 7E are diagrams explaining a method of manufacturing the actuator of the first embodiment of the present invention.

First, as shown in FIG. 7A, holes of a predetermined depth (i.e., portions that will becomes the hollow portions R of the piezoelectric bodies 26) are formed in a matrix arrangement in a rectangular-plate-shaped piezoelectric body plate 40 which has been fired, and the vias 24B are formed in the floor portions of these holes (the hollow portions R). Note that the hollow portions R and the vias 24B may be formed before the firing of the piezoelectric body plate 40.

Figure 7B:
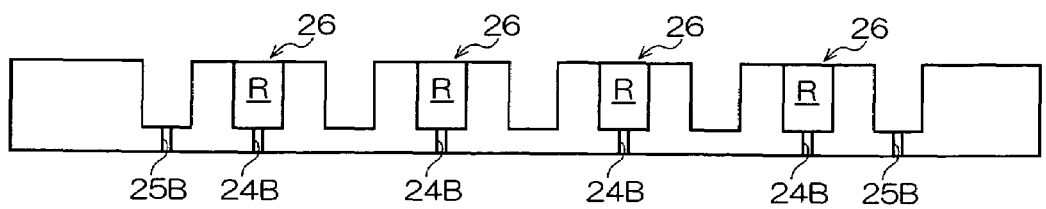

Next, as shown in FIG. 7B, the piezoelectric body plate 40 is divided into the individual piezoelectric bodies 26, and the frame portion 25A is formed. Then, the vias 25B are formed between the frame portion 25A and the piezoelectric bodies 26 at the end portions.

Figure 7C:
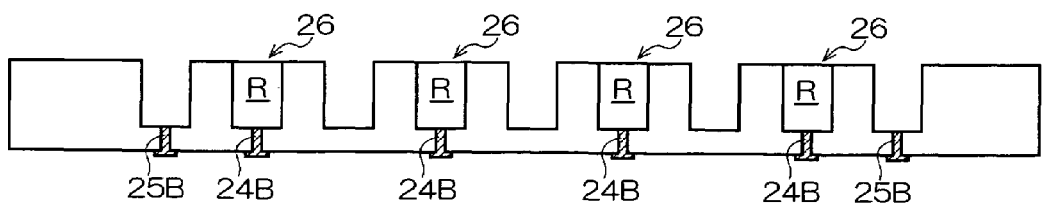
Figure 7D:
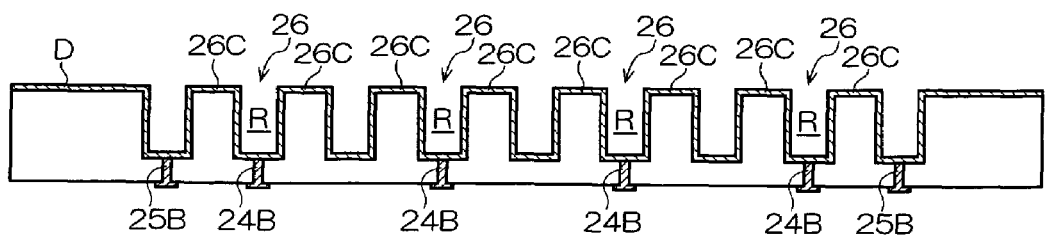

Next, as shown in FIG. 7C, a paste for connection is injected into the vias 24B, 25B, and, as shown in FIG. 7D, an electrode film D is formed over the entire piezoelectric body 26 side surface of the piezoelectric body plate 40. This electrode film D can be formed by deposition, sputtering, or the like. In this way, the vias 24B are connected to the electrode film D formed at the portions 25R of the base corresponding to the hollow regions, and the vias 25B are connected to the electrode film D formed at the outer sides of the piezoelectric bodies 26.

Figure 7E:
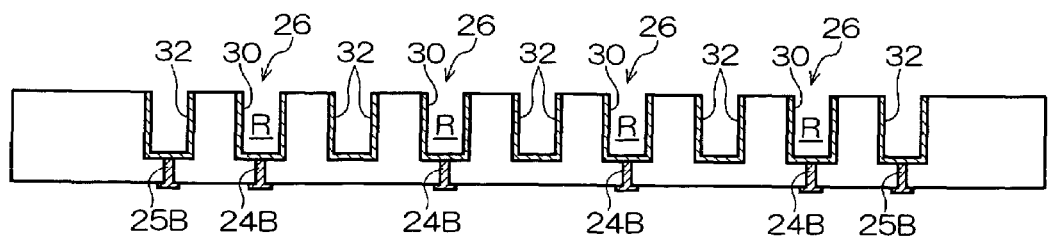

Then, as shown in FIG. 7E, the electrode film D, which is formed at the distal end surfaces 26C of the piezoelectric bodies 26, is removed. This removal of the electrode film can be carried out by one-side polishing such as CMP or the like. In this way, the electrode film is divided into the first electrodes 30, which are formed at the inner side walls 26A of the piezoelectric bodies 26, and the second electrodes 32, which are formed at the outer side walls 26B of the piezoelectric bodies 26.

In accordance with the above-described method of manufacturing an actuator, the electrode film is formed in one step, and thereafter, by removing the electrode film at the distal end surface 26C portions of the piezoelectric bodies 26, the first electrodes 30 and the second electrodes 32 can be easily formed. Further, the connection with the vias 24B, 25B can also be carried out in the electrode film forming step.

Second Embodiment

A second embodiment of the present invention will be described next. In the present embodiment, portions which are similar to those of the first embodiment are denoted by the same reference numerals, and detailed description thereof is omitted.

In the present embodiment, the overall structure of the inkjet recording device is similar to that of the first embodiment, and therefore, detailed description thereof is omitted.

Figure 8:
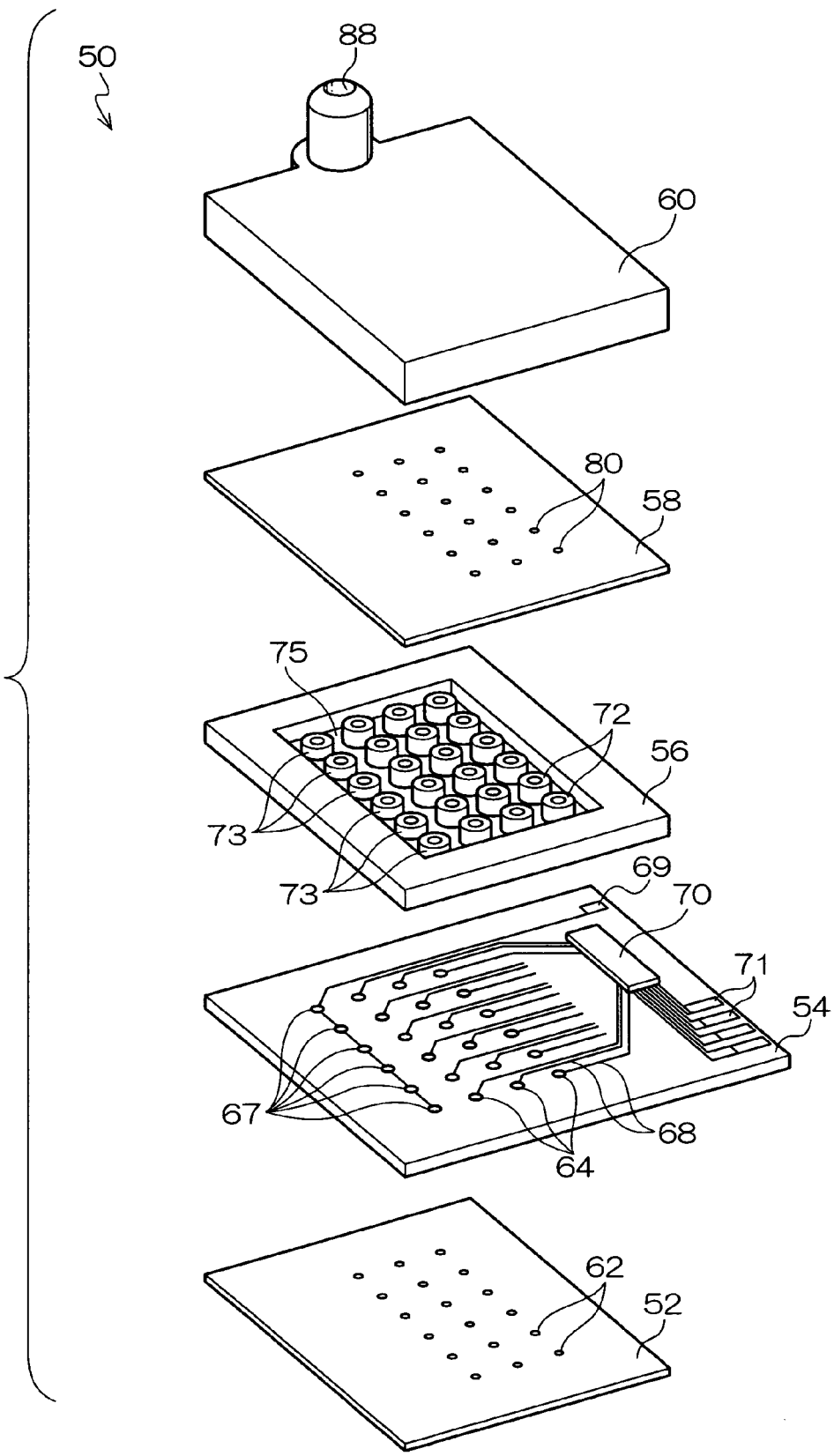
FIG. 8 is an exploded perspective view showing a disassembled state of an inkjet recording head of a second embodiment of the present invention.
Figure 9A:
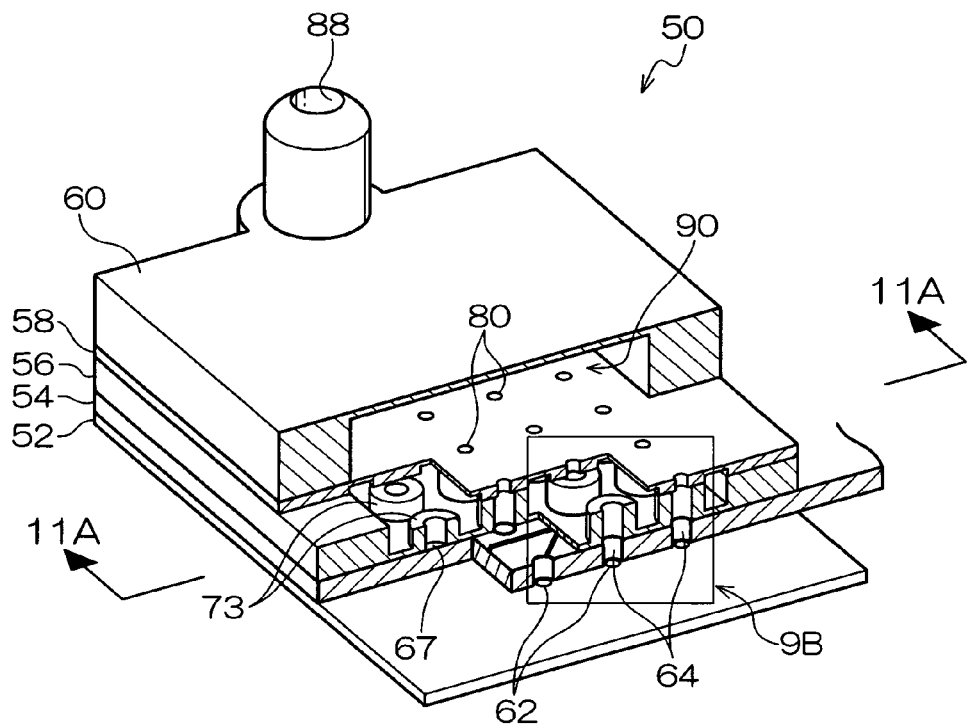
FIG. 9A is a partially broken view of the inkjet recording head of the second embodiment of the present invention.
Figure 9B:
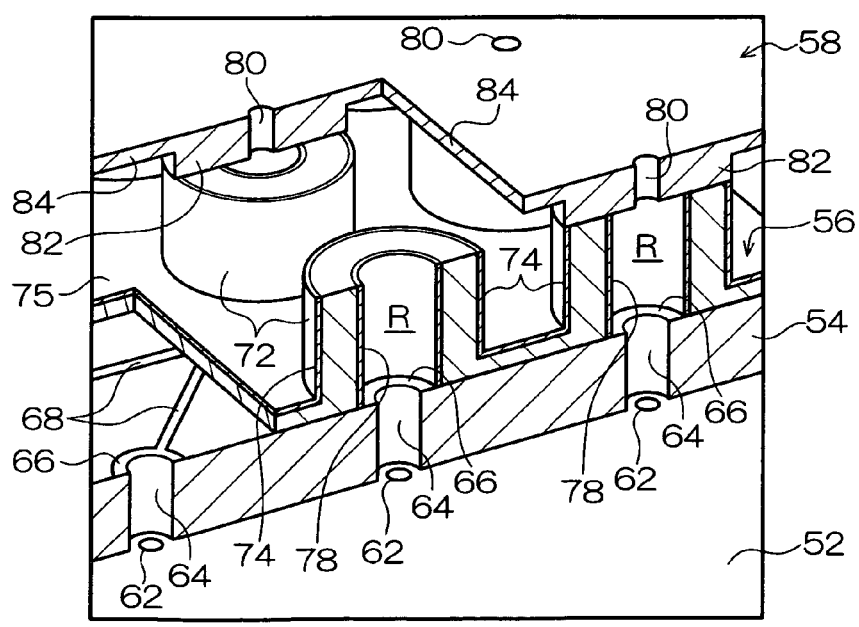
FIG. 9B is an enlarged sectional view of portion 9B of FIG. 9A.
Figure 10:
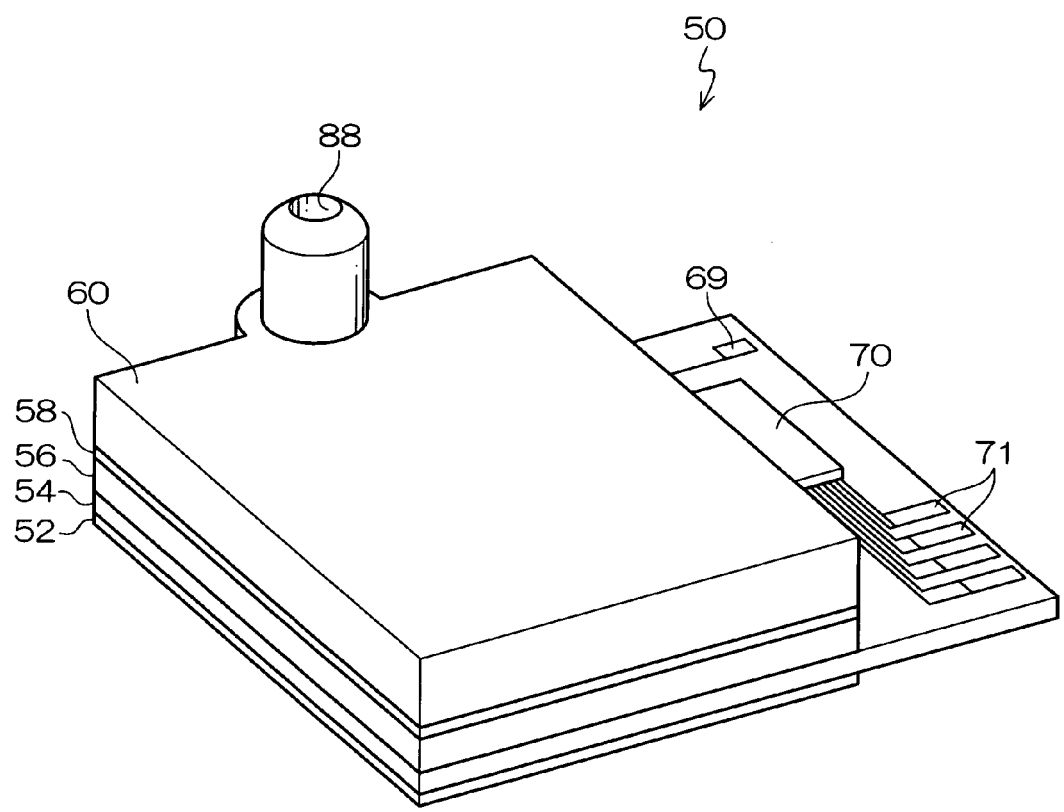
FIG. 10 is a perspective view showing the exterior of the inkjet recording head of the second embodiment of the present invention.

As shown in FIGS. 8 through 10, an inkjet recording head 50 of the present embodiment which is mounted in the inkjet recording device is structured such that a nozzle plate 52, a printed wiring board 54, an actuator 56, a supply path plate 58, and an ink pool plate 60 are laminated in that order from the lower side in the drawings, and these respective members are joined together.

As shown in FIG. 9, a plurality of nozzles 62, which are formed from circular through-holes, are disposed in the form of a matrix at predetermined intervals in the nozzle plate 52.

Figure 11A:
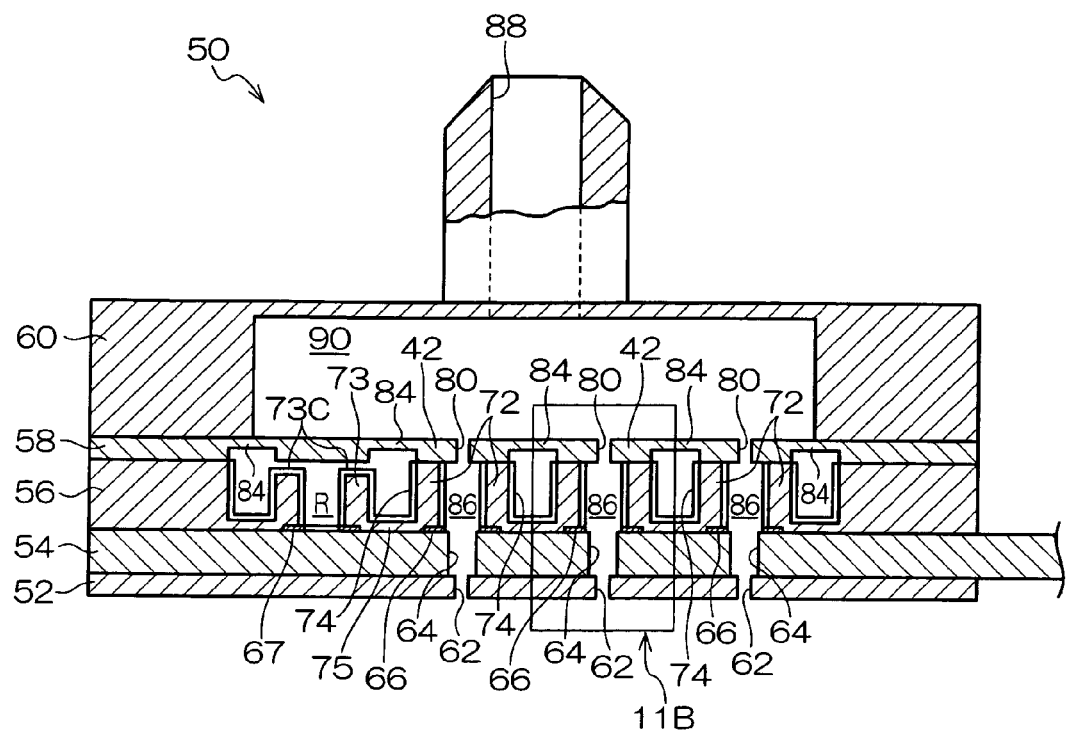
FIG. 11A is a sectional view of the inkjet recording head of the second embodiment of the present invention.
Figure 11B:
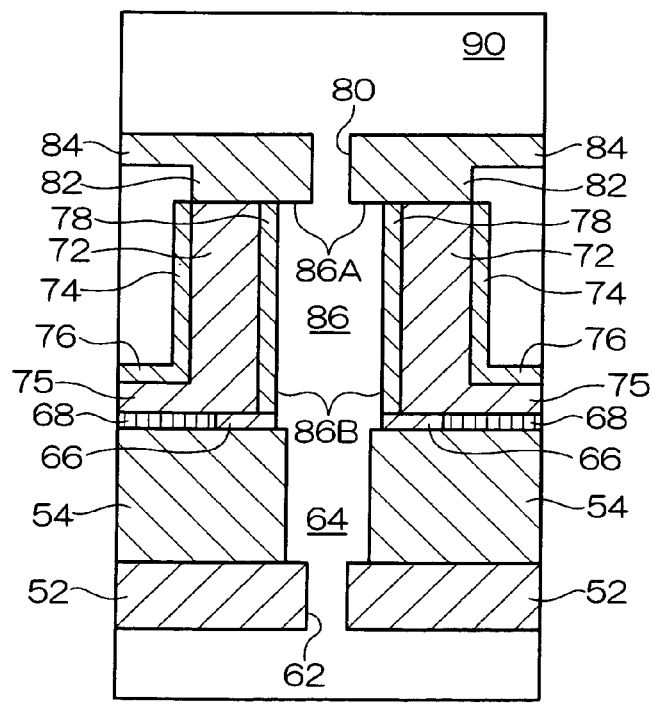
FIG. 11B is an enlarged sectional view of portion 11B of FIG. 11A.

Communicating paths 64, which are formed from circular through-holes whose diameters are slightly larger than the nozzle diameters, are formed in the printed writing board 54 at positions corresponding to the respective nozzles 62 of the nozzle plate 52 (see FIG. 9B and FIG. 11B). Annular contact electrodes 66 are formed on the top surface of the printed wiring board 54 at positions corresponding to the respective communicating paths 64. The contact electrodes 66 are electrically connected to a driving IC 70 via a wiring pattern 68 which is formed on the top surface of the printed writing board 54. Further, a control signal (print command) is inputted to the driving IC 70 from the exterior (a head controlling section), and on the basis of this control signal, electric signals (driving signals) are transmitted to piezoelectric bodies 72 of the actuator 56 which will be described later, so as to drive the piezoelectric bodies 72 at predetermined timings.

Electrodes 67 for common connection are formed in a row at the end portion, where the communicating paths 64 are not formed, of the top surface of the printed wiring board 54. The electrodes 67 for common connection are connected to a GND potential via a wiring pattern 69 formed on the top surface of the printed wiring board 54.

As shown in FIG. 8, the actuator 56 has a rectangular-plate-shaped base 75, the plurality of piezoelectric bodies 72 which are driven individually by the aforementioned driving IC 70, and piezoelectric bodies 73 for common electrode connection. The configurations of the base 75 and piezoelectric bodies 72 are substantially the same as in the first embodiment, but the hollow portions R of the piezoelectric bodies 72 pass-through to the reverse surface side of the base 75. The inner diameters of the hollow portions R are formed to be slightly larger than those of the communicating paths 64 (see FIGS. 9B and 11B). Further, the piezoelectric bodies 72 are disposed in a matrix arrangement, in correspondence with the respective nozzles 62 and the respective communicating paths 64.

The piezoelectric bodies 73 for common electrode connection have substantially the same configurations as the piezoelectric bodies 72, and are formed at positions corresponding to the electrodes 67 for common connection. The heights of the piezoelectric bodies 73 for common electrode connection are formed to be lower than the heights of the piezoelectric bodies 72 (lower by at least an amount corresponding to the thicknesses of a first electrode 78 and a second electrode 74 which will be described later).

As shown in FIGS. 11A and 11B, the second electrodes 74 are formed at the outer peripheral surfaces of the piezoelectric bodies 72 and the piezoelectric bodies 73 for common electrode connection, so as to cover the entire outer peripheral surfaces. The second electrodes 74 of the piezoelectric bodies 72 and the piezoelectric bodies 73 for common electrode connection are electrically connected together via a top surface electrode 76 which is formed on the top surface of the base 75. Further, the first electrodes 78 are formed at the inner peripheral surfaces of the piezoelectric bodies 72 and the piezoelectric bodies 73 for common electrode connection, so as to cover the entire inner peripheral surfaces. The first electrodes 78 of the piezoelectric bodies 72 are electrically connected due to the bottom end portions thereof contacting the contact electrodes 66 on the printed wiring board 54.

Distal end surface electrodes 73C are formed on the distal end surfaces of the piezoelectric bodies 73 for common electrode connection. Accordingly, at the piezoelectric bodies 73 for common electrode connection, the first electrodes 78 and the distal end surface electrodes 73 are connected to the second electrodes 74. The electrodes 67 for common connection are pulled-out from the hollow portions R provided in the piezoelectric bodies 73 for common electrode connection, and are connected to the GND potential via the wiring pattern 69.

In this way, by providing the second electrode 74 at the outer peripheral surface of the tubular piezoelectric body 72 and the first electrode 78 at the inner peripheral surface thereof, the piezoelectric body 72 is structured such that the polarization direction becomes the in-out direction of the piezoelectric body 72, and in detail, becomes the direction heading from the outer side of the piezoelectric body 72 to the inner side. Further, due to the side surface in the polarization direction of the piezoelectric body 72 (i.e., the outer side wall) being connected to the base 75, the piezoelectric body 72 is structured as a so-called wall-type piezoelectric element. In this way, when the electric signal from the driving IC is applied to the piezoelectric body 72 which is disposed between the first electrode 78 and the second electrode 74, the piezoelectric body 72 carries out a predetermined deformation operation which will be described later.

Supply paths 80, which are formed from circular through-holes which have slightly smaller diameters than the inner diameters of the piezoelectric bodies 72, are formed in the supply path plate 58 at positions corresponding to the respective piezoelectric bodies 72 of the actuator 56 (see FIG. 9B and FIG. 11B). Projecting portions (thick-walled portions) 82, which project-out in the forms of circles whose centers are the supply paths 80 and which have substantially the same diameters as the outer diameters of the piezoelectric bodies 72, are provided at positions of the bottom surface of the supply path plate 58, which positions correspond to the respective piezoelectric bodies 72. These projecting portions 82 are strongly joined to the piezoelectric bodies 72. Further, the projecting portions 82 are connected, and the connected portions thereof (the peripheries of the projecting portions 82) are formed to be thinner-walled than the supply path plate 58 main body and the projecting portions 82. Damper portions 84 having low rigidity are formed by these connected portions.

When the supply path plate 58 is laminated on the actuator 56, as shown in FIGS. 11A and 11B, pressure chambers 86 are formed at the hollow portions R of the tubular piezoelectric bodies 72. A top wall surface 86A of the pressure chamber 86 is formed by the bottom surface (movable inner wall surface) of the projecting portion 82. An inner side wall surface 86B, which is shaped as a peripheral surface, is formed by the inner peripheral surface (the deforming portion) of the piezoelectric body 72 at which the first electrode 78 is covered and formed.

As shown in FIGS. 9A and 11A, a cavity is formed in the bottom surface side of the ink pool plate 60, and an ink inlet (ink supply path) 88, which communicates with the cavity, is provided at the top surface. When the ink pool plate 60 is laminated on the supply path plate 58, an ink pool 90 is formed between the ink pool plate 60 and the supply path plate 58 by the aforementioned cavity. Further, the damper portions 84 of the supply path plate 58 are structural regions which structure portions of an inner wall of the ink pool 90. Ink is supplied into the ink pool 90 from the exterior (an ink tank) through the ink inlet 88, and is stored in the ink pool 90.

The inkjet recording head 50 of the present embodiment is structured as described above. In this inkjet recording head 50, as described above, the respective portions from the nozzles 62 to the ink pool 90 (i.e., the nozzles 62, the communicating paths 64, the pressure chambers 86 (the piezoelectric bodies 72), the supply paths 80, and the ink pool 90) are disposed in layers by the respective structural members.

The operation and effects of printing (ink ejection) by the inkjet recording head 50 of the above-described, present embodiment will be described next.

In the printing by the inkjet recording head 50, first, the ink which is pooled in the ink pool 90 is supplied through the supply paths 80 to the pressure chambers 86, and is filled from the pressure chambers 86 through the communicating paths 64 to the nozzles 62.

Figure 12A:
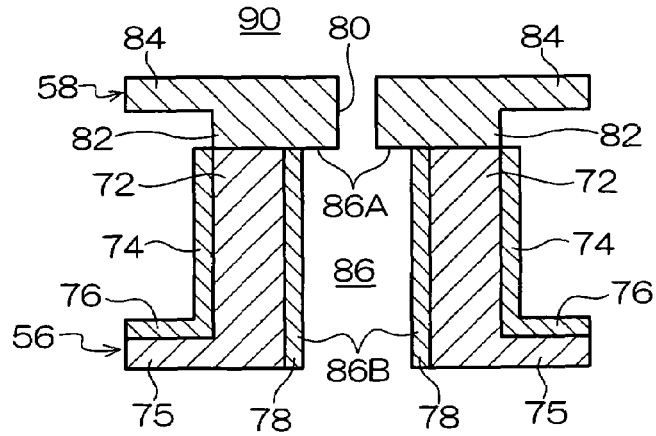
FIG. 12A is a sectional view showing an un-deformed state of a pressure chamber and a piezoelectric element of the second embodiment of the present invention.

Here, if an electric signal is not applied between the first electrode 78 and the second electrode 74 of the piezoelectric body 72, as shown in FIG. 12A, the configuration of the piezoelectric body 72 remains cylindrically tubular. When an electric signal is applied between the first electrode 78 and the second electrode 74 in accordance with a print command, the piezoelectric body 72 deforms so as to swell in the shape of a barrel as seen in an axial direction cross-section, as shown in FIG. 12B.

Figure 12B:
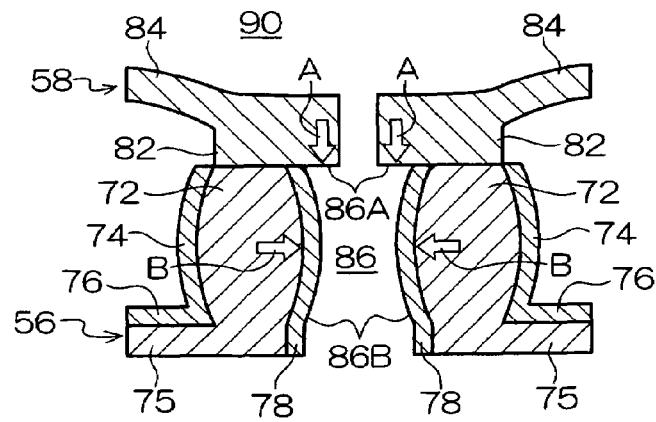
FIG. 12B is a sectional view showing a deformed state of the pressure chamber and the piezoelectric element of the second embodiment of the present invention.
Figure 12C:
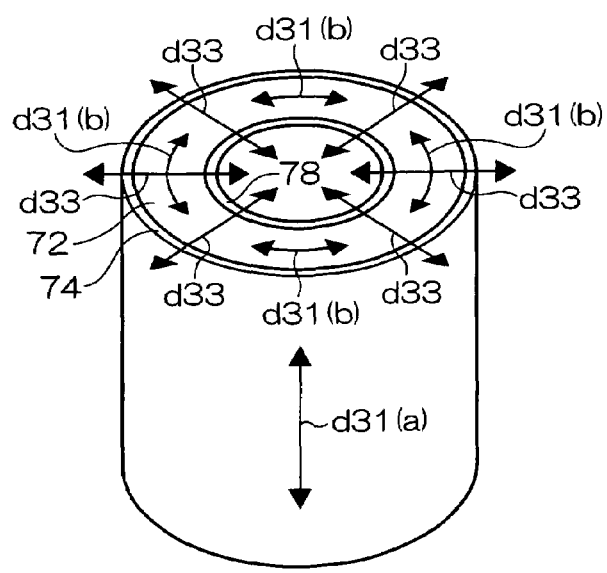
FIG. 12C is a perspective view showing deforming directions of the piezoelectric element of the second embodiment of the present invention.

As shown in FIG. 12C, at the piezoelectric body 72 of the present embodiment, the electric signal is applied in the polarization direction, and due to the piezoelectric longitudinal effect (d33) which causes strain in the direction parallel to the polarization direction, the piezoelectric body 72 swellingly deforms in the radial direction shown by arrows d33. Further, the electric signal is applied in the polarization direction, and due to the piezoelectric transverse effect (d31) which causes strain in the direction orthogonal to the polarization direction, the piezoelectric body 72 compressively deforms in the axial direction shown by arrow d31(*a*), and contractingly deforms in the peripheral direction as shown by arrows d31(*b*). In this way, the cylindrical-tube-shaped piezoelectric body 72 deforms in three directions which are the radial direction due to the piezoelectric longitudinal effect, and the axial direction and the peripheral direction due to the piezoelectric transverse effect.

Here, due to the compressive deformation of the piezoelectric body 72 in the axial direction caused by the piezoelectric transverse effect, the projecting portion 82 of the supply path plate 58 which is joined to the top end surface of the piezoelectric body 72, i.e., the top wall surface 86A of the pressure chamber 86, moves toward the nozzle 62 (in the direction of arrows A of FIG. 12B), and applies pressure to and compresses the ink within the pressure chamber 86. Moreover, the swelling deformation of the piezoelectric body 72 in the radial direction due to the piezoelectric longitudinal effect, and the contracting deformation in the peripheral direction due to the piezoelectric transverse effect, are combined together, and the inner peripheral surface (the deforming portion) of the piezoelectric body 72, i.e., the inner side wall 86B of the pressure chamber 86, swells inwardly (arrows B in FIG. 12B), and applies pressure to and compresses the ink within the pressure chamber 86. Then, the ink within the pressure chamber 86, which is pressurized due to the deformation of the pressure chamber 86 in two directions due to these two deforming operations, is ejected via the communicating path 64 from the nozzle 62 as an ink drop.

Next, when the application of the electric signal to the first electrode 78 and the second electrode 74 stops and the charges which have accumulated at the piezoelectric body 72 are discharged, the piezoelectric body 72 returns from the state shown in FIG. 12B to its original cylindrical-tubular-shape shown in FIG. 12A. Accompanying this, due to the return force of the meniscus formed within the nozzle 62, an amount of ink corresponding to the ejected amount is refilled into the pressure chamber 86 through the supply path 80 from the ink pool 90.

By repeating this ink ejecting operation, ink drops are continuously ejected from the nozzle 62 of the inkjet recording head 50, and are printed on a sheet or the like.

As described above, in order to eject the ink, which is supplied from the ink pool 90 via the supply path 80 to the pressure chamber 86, as an ink drop from the nozzle 62, the inkjet recording head 50 of the present embodiment is structured so as to deform the pressure chamber 86 by the deformation of the piezoelectric body 72 and apply pressure to the ink within the pressure chamber 86. The piezoelectric body 72 deforms the pressure chamber 86 in two directions by the deformation due to the piezoelectric longitudinal effect and the piezoelectric transverse effect. Therefore, the efficiency of generating pressure is improved as compared with a case of deforming the pressure chamber, for example, by deformation only due to the piezoelectric longitudinal effect or by deformation only due to the piezoelectric transverse effect.

Further, in the present embodiment, the inner peripheral surface, which is the deforming portion of the piezoelectric body 72 which forms the inner side wall 86B of the pressure chamber 86, directly applies pressure to the ink within the pressure chamber 86. Therefore, the loss of the pressure applied to the ink is made to be small, and the pressure generated by the deformation of the piezoelectric body 72 is efficiently transferred to the ink.

Further, in the present embodiment, as the piezoelectric body 72 deforms, the top wall surface 86A of the pressure chamber 86 moves, and pressure is applied in and reduced in the direction of ejecting the ink within the pressure chamber 86 (i.e., toward the nozzle 62). In this way, deformation of the pressure chamber 86 in the ink ejecting direction is possible, and the efficiency of generating pressure can be improved. Moreover, the top wall surface 86A (movable inner wall surface) of the pressure chamber 86 which is this movable structure is formed by the supply path plate 58 (the projecting portion 82). The inkjet recording head 50 can thereby be made to be compact as compared with a case of providing a plate or the like which is exclusively used for forming such a movable inner wall surface.

In the present embodiment, by forming the piezoelectric body 72 in the form of a cylindrical tube and providing the pressure chamber 86 at the interior thereof, the ink within the pressure chamber 86 can be pressurized by the entire inner peripheral surface of the piezoelectric body 72 (the inner side wall surface 86B of the pressure chamber 86), and the efficiency of generating pressure can be improved. In addition, with such a cylindrical-tube-shaped piezoelectric body 72, the piezoelectric bodies 72 (pressure chambers 86) and the nozzles 62 can be disposed at a high density, and therefore, high resolution of the printed image can be realized.

The piezoelectric bodies 72 are driven at high speed in the above-described ink ejecting operation in the present embodiment. However, when, accompanying this high-speed driving, the piezoelectric bodies 72 and the top wall surfaces 86A of the pressure chambers 86 (i.e., the projecting portions 82) vibrate, the vibration is damped by the damper portions 84 which join the projecting portions 82 together and which have lower rigidity than the supply path plate main body. The effects of the driving operations between adjacent piezoelectric bodies 72 (cross-talk) can thereby be reduced.

Because the damper portions 84 are structural regions which structure portions of an inner wall of the ink pool 90, the pressure generated at the pressure chambers 86 in order to expel ink drops is absorbed by the damper portions 84. In this way, it is possible to remedy the problem of the pressure, which is generated at a specific pressure chamber 86 at the time of ejecting an ink drop, being transmitted from the supply path 80 to the ink pool 90 and adversely affecting the generation of pressure at adjacent pressure chambers 86. Accordingly, the ink ejecting performance is stable.

In the present embodiment, the respective portions provided at the inkjet recording head 50 (the nozzles 62, the communicating paths 64, the pressure chambers 86 (the piezoelectric bodies 72), the supply paths 80, and the ink pool 90) are disposed at different layers. In this way, these respective portions are formed so as to be distributed among a plurality of structural members, and the inkjet recording head 50 can be manufactured by laminating the respective structural members. The ability to manufacture the inkjet recording head 50 is thereby improved.

By providing the above-described inkjet recording head 50 in the inkjet recording device of the present embodiment, a reduction in the consumption of electric power is achieved.

The method of manufacturing the inkjet recording head 50 of the present embodiment will be described next.

Figure 13A:
FIGS. 13A through 13C are diagrams explaining a method of manufacturing an actuator of the second embodiment of the present invention.

First, the manufacturing of the base 75, the piezoelectric bodies 72, and the piezoelectric bodies 73 for common electrode connection of the actuator 56 will be described. As shown in FIG. 13A, pass-through openings (portions which are to become the hollow portions R of the piezoelectric bodies 72 and the piezoelectric bodies 73 for common electrode connection) are formed in a matrix arrangement in the rectangular-plate-shaped piezoelectric body plate 40 which has been fired. Note that the pass-through openings (the hollow portions R) may be formed before firing of the piezoelectric body plate 40. The formation of the pass-through openings (the hollow portions R) can be carried out by sandblasting, or, if before firing, by punching or the like.

Figure 13B:

Next, as shown in FIG. 13B, a predetermined depth of a portion (K), where the piezoelectric bodies 73 for common electrode connection are to be disposed, is removed along a straight line. The removal here can be carried out by dicing or the like.

Figure 13C:
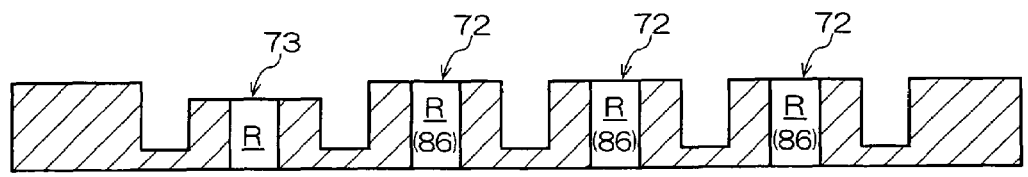

Subsequently, as shown in FIG. 13C, the portions corresponding to the piezoelectric bodies 72 and the piezoelectric bodies 73 for common electrode connection are divided into a matrix form. The separation here can be carried out by wire working, dicing, or the like.

In this way, the actuator 56 before electrode formation is manufactured.

Next, the printed wiring board 54 and the actuator 56 before electrode formation are joined. The communicating paths 64 are formed in the printed wiring board 54 at positions corresponding to the pass-through openings (the hollow portions R) of the piezoelectric bodies 72. The communicating paths 64 are formed to have smaller diameters than the pass-through openings (the hollow portions R).

Figure 14A:
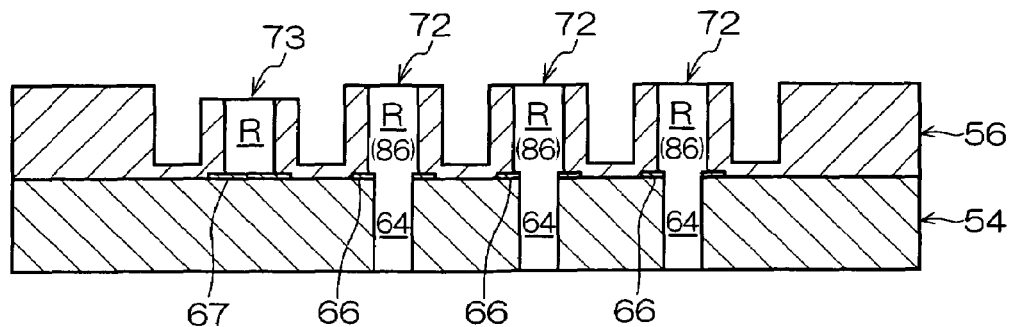
FIGS. 14A through 14D are diagrams explaining the method of manufacturing the actuator of the second embodiment of the present invention.

In the joining of the printed wiring board 54 and the actuator 56 before electrode formation, as shown in FIG. 14A, the base 75 side of the actuator 56 and the wiring surface of the printed wiring board 54 are made to face one another, and are joined together such that the contact electrodes 66 of the top surface of the printed wiring board 54 are exposed at the pass-through openings (the hollow portions R) of the piezoelectric bodies 72, and the electrodes 67 for common connection are exposed at the pass-through openings (the hollow portions R) of the piezoelectric bodies 73 for common electrode connection.

Figure 14B:
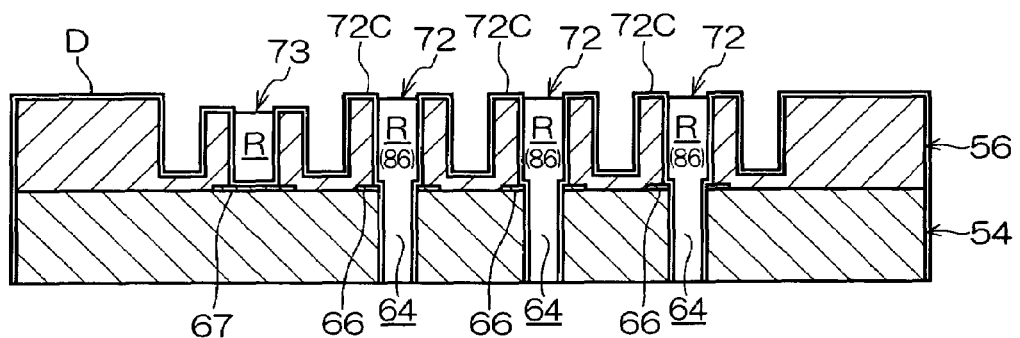

Next, as shown in FIG. 14B, the electrode film D is formed on the entire surface at the actuator 56 side and the inner walls of the communicating paths 64 of the printed wiring board 54. The formation of the electrode film D can be carried out by Cu deposition, sputtering, or the like. In this way, the electrode film D and the contact electrodes 66 and electrodes 67 for common connection of the printed wiring board 54 are also connected.

Figure 14C:
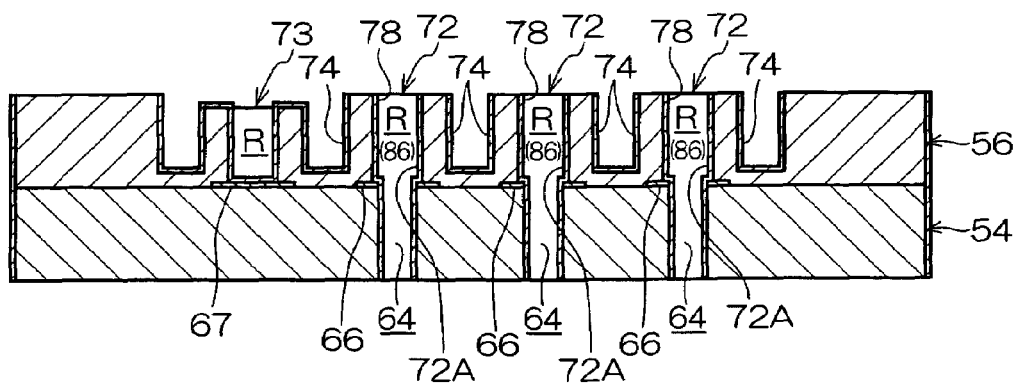

Then, as shown in FIG. 14C, the electrode film D formed at the distal end surfaces 72C of the piezoelectric bodies 72 is removed. The removal of the electrode film D can be carried out by one-side polishing such as CMP or the like. In this way, the electrode film D is divided into the first electrodes 78, which are formed at inner side walls 72A of the piezoelectric bodies 72, and the second electrodes 74, which are formed at outer side walls 72B of the piezoelectric bodies 72.

Figure 14D:
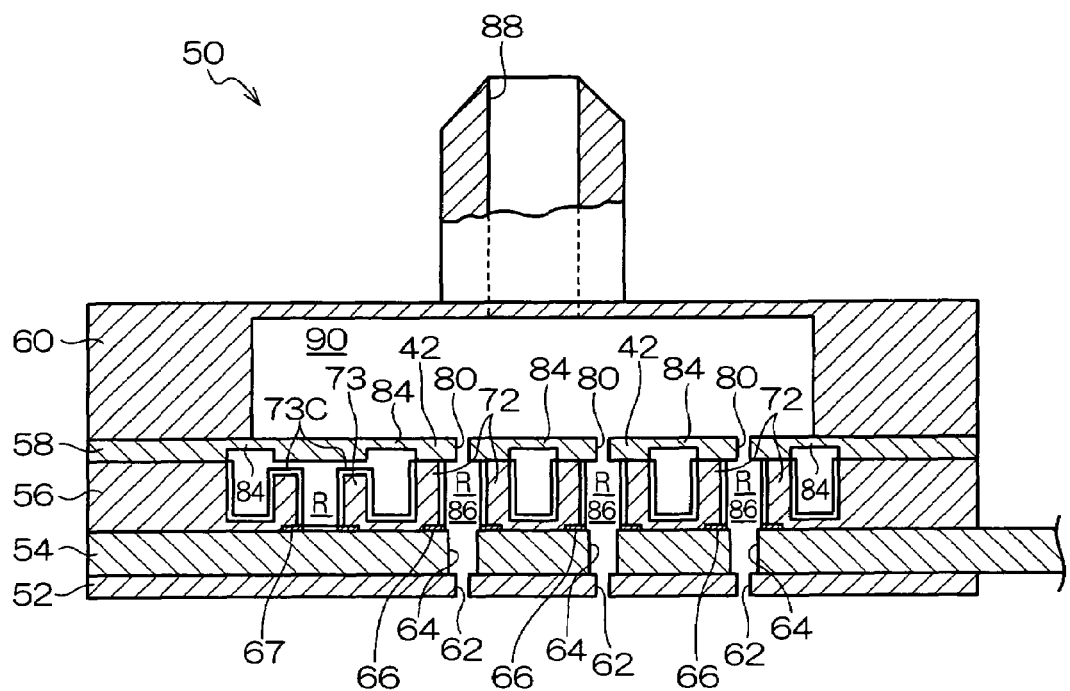

Next, as shown in FIG. 14D, the nozzle plate 62 is joined to the bottom side of the printed wiring board 54, and the supply path plate 58 is joined to the top side of the actuator 56. At this time, joining is carried out by carrying out alignment such that the nozzles 62 and the communicating paths 64 communicate, and such that the hollow portions R and the supply paths 80 communicate.

Then, the ink pool plate 60 is joined to the top portion of the supply path plate 58, and the inkjet recording head 50 is manufactured.

In accordance with the above-described manufacturing method, the electrode film D is formed in one step. Thereafter, by removing the electrode film D at the portions of the distal end surfaces 72C of the piezoelectric bodies 72, the first electrodes 78 and the second electrodes 74 can be formed easily. Moreover, the connection of the electrode film and the contact electrodes 66 and the electrodes 67 for common connection also can be carried out in the electrode film forming step.

Because the piezoelectric bodies 73 for common electrode connection are formed to be shorter than the piezoelectric bodies 72, at the time of removing the electrode film D of the portions of the distal end surfaces 72C of the piezoelectric bodies 72, the electrode film of distal end surfaces 73A of the piezoelectric bodies 73 for common electrode connection is not removed by polishing, and the common electrodes can be easily pulled-out to the printed wiring board 54 side through the hollow portions R.

Third Embodiment

The third embodiment is a modified example of the actuator used in the above-described inkjet recording head 50.

Figure 15A:
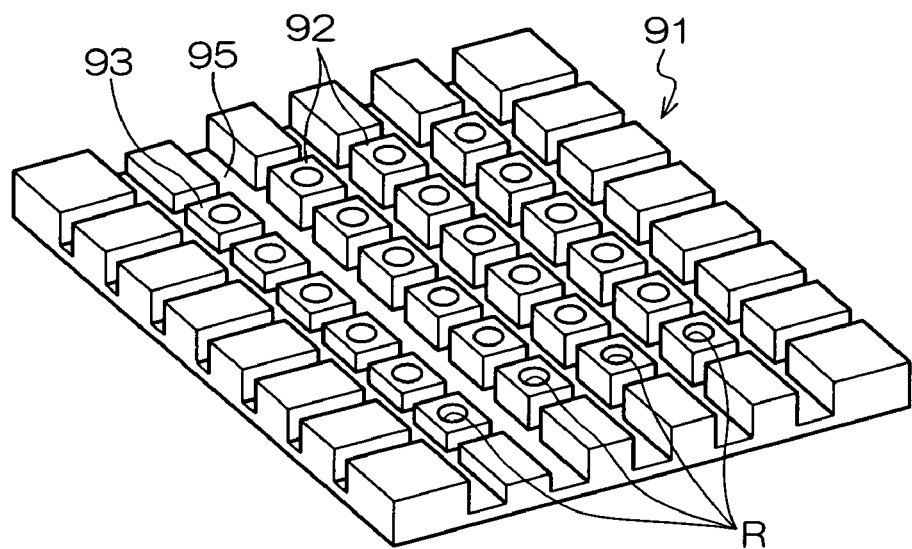
FIG. 15A is a perspective view showing the exterior of an actuator of a third embodiment of the present invention.
Figure 15B:
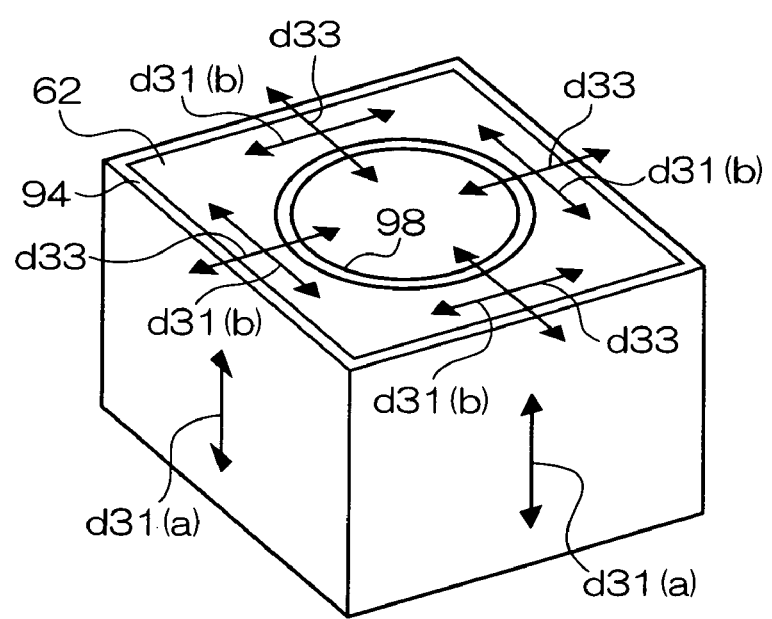
FIG. 15B is an enlarged perspective view showing deforming directions of a piezoelectric body structuring the actuator of the third embodiment of the present invention.

As shown in FIG. 15A, a plurality of piezoelectric bodies 92 which are provided at an actuator 91 of the present embodiment are formed in the shapes of rectangular tubes. In the same way as in the second embodiment, the piezoelectric bodies 92 as well are disposed in a matrix arrangement in correspondence with the respective nozzles 62 of the nozzle plate 52, and the lower end portions thereof are connected to and integral with a thin-walled base 95. Further, as shown in FIG. 15B, a second electrode 94 is formed at the outer peripheral surface of the piezoelectric body 92 so as to cover the entire outer peripheral surface, and a first electrode 98 is formed at the inner peripheral surface so as to cover the entire inner peripheral surface. The polarization direction is the in-out direction of the piezoelectric body 92 (the direction heading from the outer side to the inner side).

At the piezoelectric body 92 as well, as shown in FIG. 15B, when an electric signal is applied between the second electrode 94 and the first electrode 98, due to the piezoelectric longitudinal effect (d33), the piezoelectric body 92 swellingly deforms in the in-out direction shown by arrows d33, and due to the piezoelectric transverse effect (d31), compressively deforms in the axial direction shown by arrows d31(a) and contractingly deforms in the lateral directions shown by arrows d31(b), and, as seen in the axial direction cross-section, deforms in the directions of arrows A and B shown in FIG. 12B.

Accordingly, also in the case of the piezoelectric body 92 having such a rectangular-tubular shape, the respective deformations due to the piezoelectric longitudinal effect and the piezoelectric transverse effect are combined, and the efficiency of generating pressure can be improved.

Next, the method of manufacturing the actuator 91 of the present embodiment will be described.

Figure 16A:
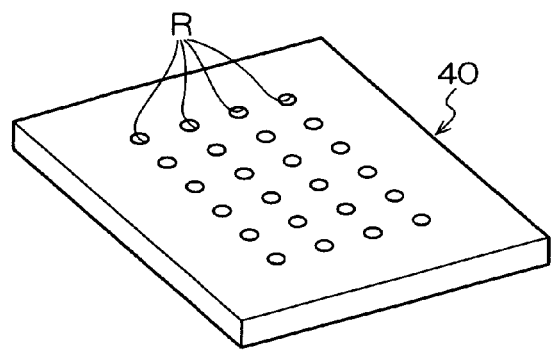
FIGS. 16A through 16D are diagrams explaining a method of manufacturing the actuator of the third embodiment of the present invention.

As shown in FIG. 16A, pass-through openings (the hollow portions R) are formed in the form of a matrix in the rectangular-plate-shaped piezoelectric body plate 40 which has been fired. Note that the pass-through openings (the hollow portions R) may be formed before firing of the piezoelectric body plate 40. The formation of the pass-through openings (the hollow portions R) can be carried out by sandblasting, or, if before firing, by punching or the like.

Figure 16B:
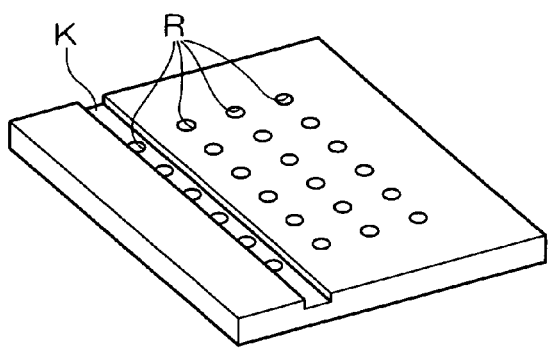

Next, as shown in FIG. 16B, a predetermined depth of a portion (K), where piezoelectric bodies 93 for common electrode connection are to be disposed, is removed along a straight line. The removal here can be carried out by dicing or the like.

Figure 16C:
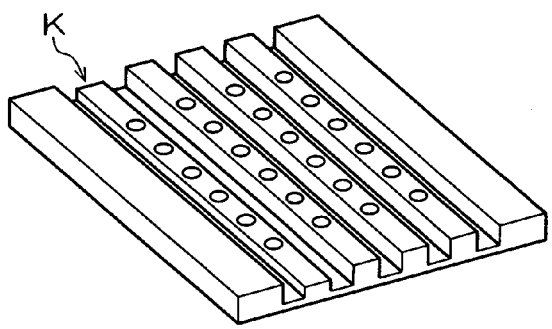

Subsequently, as shown in FIG. 16C, grooves, which are parallel to the aforementioned portion K, are formed at the both sides of the portions corresponding to the piezoelectric bodies 92 and piezoelectric bodies 93 for common electrode connection.

Figure 16D:
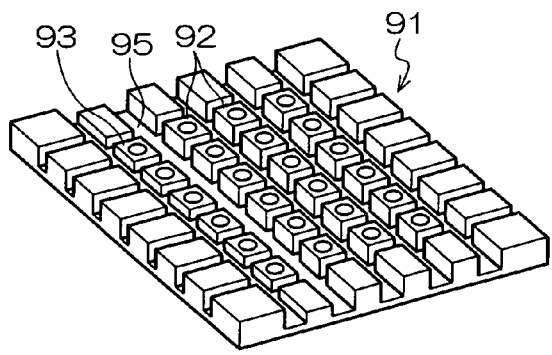

Then, as shown in FIG. 16D, grooves, which are orthogonal to the aforementioned portion K, are formed at the both sides of the portions corresponding to the piezoelectric bodies 92 and the piezoelectric bodies 93 for common electrode connection, and the piezoelectric bodies 92 and the piezoelectric bodies 93 for common electrode connection are separated. The separation here can be carried out by wire working, dicing, or the like.

The actuator 91 before electrode formation is manufactured as described above. The formation of the electrode film is carried out in the same way as in the second embodiment.

In the case of rectangular-tube-shaped bodies such as in the present embodiment, when forming the plurality of piezoelectric elements at a single substrate by using etching or the like, as compared with cylindrical-tubular bodies or the like, the formation of the individual piezoelectric elements is easy and the piezoelectric elements can be disposed at smaller intervals. In this way, in the case of forming a plurality of piezoelectric elements in a matrix arrangement as in the first and second embodiments, rectangular-tubular piezoelectric elements can be disposed at a higher density than cylindrical-tubular ones and without wasting space, and the nozzles can be disposed at an even higher density.

Figure 17A:
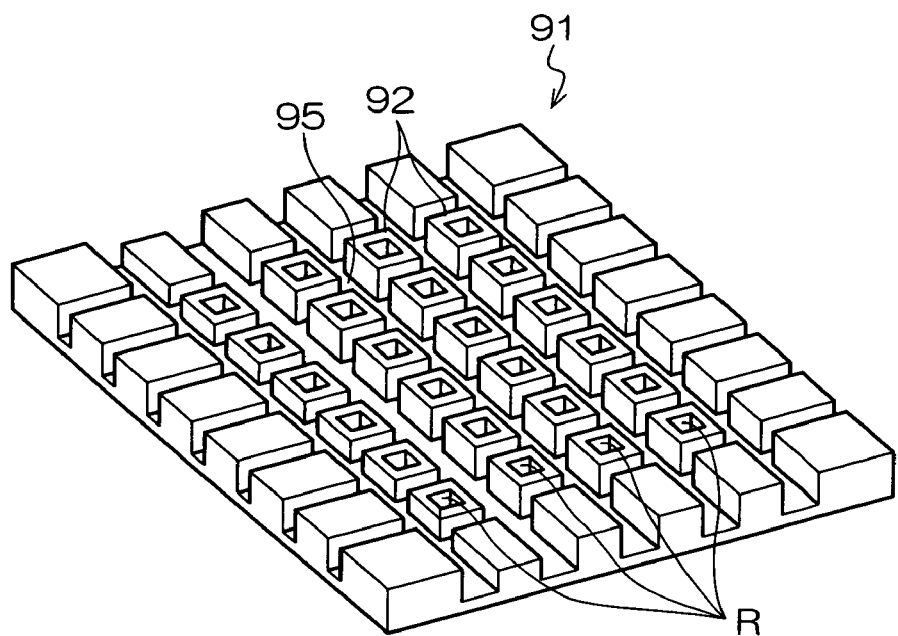
FIG. 17A is a perspective view showing the exterior of a modified example of the actuator of the third embodiment of the present invention.
Figure 17B:
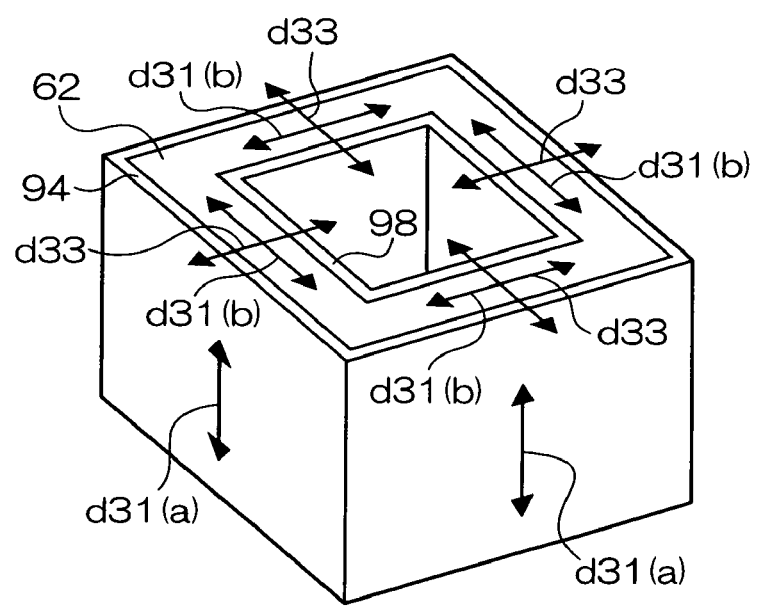
FIG. 17B is an enlarged perspective view showing deforming directions of a piezoelectric body of the modified example of the actuator of the third embodiment of the present invention.

Note that the hollow portions R are cylindrical in the present embodiment, but may be formed in the shapes of rectangular pillars as shown in FIGS. 17A and 17B.

Fourth Embodiment

The fourth embodiment is a modified example in which the structure of the printed wiring board is changed in the inkjet recording head 50 described in the second embodiment.

Figure 18:
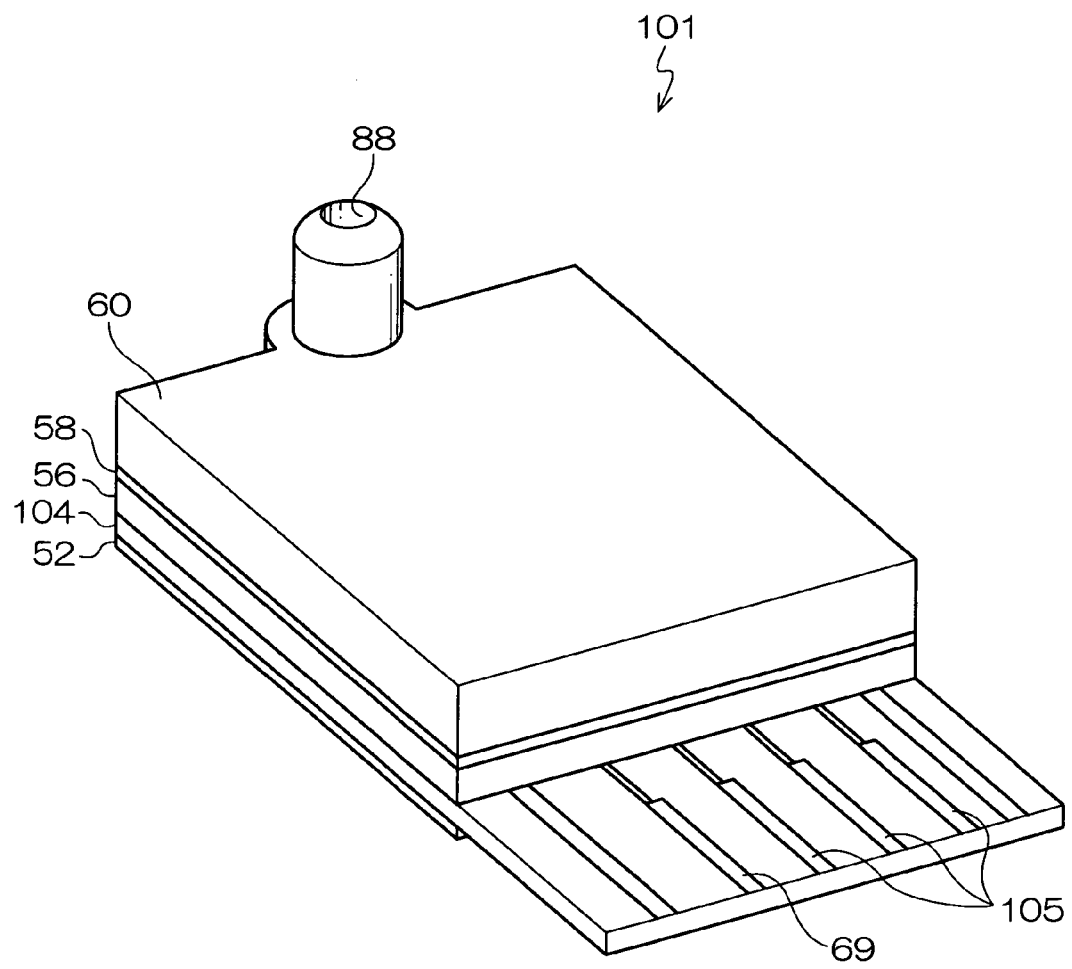
FIG. 18 is a perspective view showing the exterior of an inkjet recording head of a fourth embodiment of the present invention.

As shown in FIG. 18, in the same way as in the second embodiment, an inkjet recording head 70 of the present embodiment is structured by the nozzle plate 52, a printed wiring board 104, the actuator 56, the supply path plate 58, and the ink pool plate 60 being laminated.

Here, as shown in FIG. 19, a plurality of driving elements (IC chips) 106, which transmit electric signals for driving the piezoelectric bodies 72, are formed on the top surface of the printed wiring board 104 of the present embodiment. These driving elements 106 are formed together with the wiring pattern and the like in the process of manufacturing the printed wiring board 104. The driving elements 106 are disposed in vicinities of the respective communicating paths 64 which are formed in correspondence with the respective nozzles 62 of the nozzle plate 52, i.e., are disposed in vicinities of the respective nozzles 62, and are electrically connected to the respective contact electrodes 66 via the wiring pattern formed on the board. Further, when control signals are inputted from the exterior through contact portions 105 formed at the end portion of the top surface of the printing wiring board 104, on the basis of the control signals, the driving elements 106 output electric signals to the respective piezoelectric bodies 72 of the actuator 56, and drive the respective piezoelectric bodies 72.

An inkjet recording head 101 of the present embodiment is structured as described above. In this inkjet recording head 101, there is no need for a step for packaging, on the printed wiring board, the driving IC 30 such as described in the second embodiment, and therefore, the ability to manufacture the inkjet recording head 101 is improved. Further, the driving elements 106, which generate heat as they drive the piezoelectric bodies 72, are cooled by the flows of the inks ejected from the nozzles 62. Thus, it is possible to suppress malfunctioning of the driving elements 106 due to a rise in temperature, and the generation of heat (thermal stress) of the inkjet recording head 101. Moreover, at the portions on the printed wiring board 104 which are not covered by the piezoelectric bodies 72 (i.e., at the exposed portions), the wiring pattern (electric wires) can be disposed at a low density, and therefore, the electrical reliability can be improved as compared with the structure of the second embodiment.

The present invention has been described in detail above in accordance with the first through fourth embodiments. However, the present invention is not to be limited to these embodiments, and various other embodiments can be implemented within the scope of the present invention.

For example, the nozzle plate 12 and the printed wiring board are separate bodies in the above-described embodiments, but can be formed integrally. In this case, the step of joining the nozzle plate and the printed wiring board can be eliminated, and the ability to manufacture the inkjet recording head improves.

Further, the present invention is not limited to the above-described inkjet recording head and inkjet recording device, and can also be applied to other liquid droplet ejecting heads and liquid droplet ejecting devices which are used in a pattern forming device which ejects liquid drops for pattern formation of a semiconductor or the like, or the like.

As described above, the actuator of the first aspect of the present invention has: a piezoelectric body formed in a shape of a tube and having an inner side wall, which faces a hollow portion of the tube, and an outer side wall, which is structured at an outer side of the tube; a first electrode formed at the inner side wall of the piezoelectric body; and a second electrode formed at the outer side wall of the piezoelectric body, wherein the actuator displaces the piezoelectric body by a potential difference between the first electrode and the second electrode.

The actuator of the first aspect has a piezoelectric body which is formed in the shape of a tube. Here, the shape of the tube is not limited to a cylindrical tube shape, and includes all shapes in which a hollow portion is formed at the central portion of a pillar-like body. It also includes shapes in which a cut-out is formed in a portion of a side wall portion of a tube such that the hollow portion communicates with the exterior at the side wall portion.

The first electrode is formed at the inner side wall which faces the hollow region of the piezoelectric body. The second electrode is formed at the outer side wall which is structured at the outer side of the piezoelectric body. The piezoelectric body is displaced due to the potential difference between the first electrode and the second electrode.

In accordance with the above-described structure, because the configuration of the piezoelectric body is tubular, a large amount of displacement can be obtained by making the tube tall in the heightwise direction.

Further, because the electrodes are formed at the inner side wall and the outer side wall of the tube, the electrodes can be formed easily. Moreover, because a pair of electrodes are formed at one piezoelectric body, the respective electrodes can be pulled-out easily.

The above-described actuator may further have a substrate to which one end of the tube of the piezoelectric body is fixed.

The substrate can be structured integrally with the piezoelectric body by the same member, or can be structured by a separate member.

The actuator may be structured such that a plurality of the piezoelectric bodies are disposed on the substrate, and the first electrodes are individual electrodes of the piezoelectric bodies, and the second electrodes are common electrodes which are common to at least two or more piezoelectric bodies.

In the actuator, the first electrodes at the inner sides of the tube-shaped piezoelectric bodies may be individual electrodes of the respective piezoelectric bodies, and the second electrodes at the outer sides of the tube-shaped piezoelectric bodies may be common electrodes which are common to plural piezoelectric bodies. By forming individual electrodes and common electrodes in this way, the respective electrodes can be structured easily.

Further, in the above-described actuator, by disposing the piezoelectric bodies in the form of a matrix on the substrate, the respective piezoelectric bodies, and the individual electrodes and common electrodes can be easily disposed in a matrix-like arrangement.

The actuator may be structured such that the first electrodes are pulled-out at a side of the substrate at which the piezoelectric bodies are not fixed.

By pulling-out the first electrodes at the side of the substrate at which the piezoelectric bodies are not fixed, the first electrodes can be easily connected to wires other than the common electrodes.

In the actuator, the individual electrodes and the common electrodes may be structured of the same material.

In the actuator, pass-through openings may be formed in positions of the substrate which positions correspond to the hollow portions of the piezoelectric bodies.

By forming pass-through openings in this way, the first electrodes can be pulled-out to the opposite side of the substrate through the pass-through openings, and liquid or the like at the side of the piezoelectric bodies can be made to pass-through by using the pass-through openings.

What is claimed is:

1. An actuator comprising:
    a piezoelectric body formed in a shape of a tube and having an inner side wall, which faces a hollow portion of the tube, and an outer side wall, which is structured at an outer side of the tube;
    a substrate to which one end of the tube of the piezoelectric body is fixed;
    a first electrode formed at the inner side wall of the piezoelectric body; and
    a second electrode formed at the outer side wall of the piezoelectric body,
    wherein the actuator displaces the piezoelectric body by a potential difference between the first electrode and the second electrode.

2. The actuator of claim 1, wherein a plurality of the piezoelectric bodies are disposed on the substrate, and
    the first electrodes are individual electrodes of the piezoelectric bodies, and the second electrodes are a common electrode which is common to at least two or more piezoelectric bodies.

3. The actuator of claim 2, wherein the piezoelectric bodies are disposed in a form of a matrix on the substrate.

4. The actuator of claim 3, wherein the first electrodes are pulled-out at a side of the substrate at which the piezoelectric bodies are not fixed.

5. The actuator of claim 3, wherein the individual electrodes and the common electrode are structured of a same material.

6. The actuator of claim 3, wherein pass-through openings are formed in positions of the substrate which positions correspond to the hollow portions of the piezoelectric bodies.

7. The actuator of claim 2, wherein the first electrodes are pulled-out at a side of the substrate at which the piezoelectric bodies are not fixed.

8. The actuator of claim 7, wherein pass-through openings are formed in positions of the substrate which positions correspond to the hollow portions of the piezoelectric bodies.

9. The actuator of claim 2, wherein the individual electrodes and the common electrode are structured of a same material.

10. The actuator of claim 2, wherein pass-through openings are formed in positions of the substrate which positions correspond to the hollow portions of the piezoelectric bodies.

11. The actuator of claim 1, wherein the first electrode is pulled-out at a side of the substrate at which the piezoelectric body is not fixed.

12. The actuator of claim 3, wherein the individual electrodes and the common electrode are structured of a same material.

13. The actuator of claim 11, wherein pass-through openings are formed in positions of the substrate which positions correspond to the hollow portions of the piezoelectric bodies.

14. The actuator of claim 1, wherein a pass-through opening is formed in a position of the substrate which position corresponds to the hollow portion of the piezoelectric body.

15. A liquid droplet ejecting head comprising an actuator which has:
    a piezoelectric body formed in a shape of a tube and having an inner side wall, which faces a hollow portion of the tube, and an outer side wall, which is structured at an outer side of the tube;
    a substrate to which one end of the tube of the piezoelectric body is fixed;
    a first electrode formed at the inner side wall of the piezoelectric body; and
    a second electrode formed at the outer side wall of the piezoelectric body,
    wherein the actuator displaces the piezoelectric body by a potential difference between the first electrode and the second electrode.

16. The liquid droplet ejecting head of claim 15, further comprising:
    a pass-through opening being formed at a position of the substrate which position corresponds to the hollow portion of the piezoelectric body;
    an electric wiring board disposed at a side of the substrate at which side the piezoelectric body is not fixed;
    a piezoelectric body for common electrode connection formed in a shape of a tube and having an inner side wall, which faces an inner side space of the tube, and an outer side wall, which is structured at an outer side of the tube, one end of the piezoelectric body for common electrode connection being fixed to a same side of the substrate as the piezoelectric body;
    an inner side electrode formed at the inner side wall of the piezoelectric body for common electrode connection;
    an outer side electrode formed at the outer side wall of piezoelectric body for common electrode connection;
    a distal end surface electrode formed at a distal end surface of the piezoelectric body for common electrode connection, and electrically connecting the inner side electrode and the outer side electrode; and
    a common electrode connecting member electrically connecting the inner side electrode and a wiring terminal of the electric wiring board,
    wherein the distal end surface of the piezoelectric body for common electrode connection is disposed at a position which is closer to the substrate than a distal end surface of the piezoelectric body.

17. The liquid droplet ejecting head of claim 15, further comprising a pass-through opening being formed at a position of the substrate which position corresponds to the hollow portion of the piezoelectric body, wherein an electric wiring board is disposed at a side of the substrate at which side the piezoelectric body is not fixed, and a wiring terminal of the electric wiring board is disposed so as to be exposed at the pass-through opening.

18. A liquid droplet ejecting device comprising a liquid droplet ejecting head having an actuator, the actuator having:

a piezoelectric body formed in a shape of a tube and having an inner side wall, which faces a hollow portion of the tube, and an outer side wall, which is structured at an outer side of the tube;

a substrate to which one end of the tube of the piezoelectric body is fixed;

a first electrode formed at the inner side wall of the piezoelectric body; and a second electrode formed at the outer side wall of the piezoelectric body, wherein the actuator displaces the piezoelectric body by a potential difference between the first electrode and the second electrode.

* * * * *